(12) United States Patent
Zhou et al.

(10) Patent No.: US 11,596,088 B2
(45) Date of Patent: Feb. 28, 2023

(54) ASYMMETRIC CONFIGURABLE DOUBLE-SIDED MANIFOLD MICRO-CHANNEL COLD PLATES

(71) Applicants: Toyota Motor Engineering & Manufacturing North America, Inc., Plano, TX (US); University of Colorado Boulder, Boulder, CO (US)

(72) Inventors: Feng Zhou, Ann Arbor, MI (US); Ercan Mehmet Dede, Ann Arbor, MI (US); Hiroshi Ukegawa, South Lyon, MI (US); Robert Erickson, Boulder, CO (US); Dragan Maksimovic, Boulder, CO (US); Vivek Sankaranarayanan, Boulder, CO (US); Yucheng Gao, Boulder, CO (US)

(73) Assignees: TOYOTA MOTOR ENGINEERING & MANUFACTURING NORTH AMERICA, INC., Plano, TX (US); UNIVERSITY OF COLORADO BOULDER, Boulder, CO (US)

( * ) Notice: Subject to any disclaimer, the term of this patent is extended or adjusted under 35 U.S.C. 154(b) by 143 days.

(21) Appl. No.: 17/162,371

(22) Filed: Jan. 29, 2021

(65) Prior Publication Data
US 2022/0248560 A1 Aug. 4, 2022

(51) Int. Cl.
*H05K 7/20* (2006.01)
(52) U.S. Cl.
CPC .......... *H05K 7/209* (2013.01); *H05K 7/2039* (2013.01)
(58) Field of Classification Search
CPC ........... H05K 7/20254; H05K 7/20509; H05K 7/20272; H05K 7/20772; H05K 7/209;
(Continued)

(56) References Cited

U.S. PATENT DOCUMENTS 7,156,159 B2 * 1/2007 Lovette ................. H01L 23/473
257/E23.098
9,437,523 B2 * 9/2016 Joshi ................... H01L 23/4735
(Continued)

FOREIGN PATENT DOCUMENTS

WO 2017031596 A1 3/2017

OTHER PUBLICATIONS

Zhou, F., et al. (2015). "Modular Design for a Single-Phase Manifold Mini/Microchannel Cold Plate." Journal of Thermal Science and Engineering Applications 8(2): 021010-1 to 021010-13.
(Continued)

*Primary Examiner* — Adam B Dravininkas
(74) *Attorney, Agent, or Firm* — Dinsmore & Shohl LLP

(57) ABSTRACT

A cold plate having a manifold includes a recess extending from a first side to a second side of the manifold, where the recess includes openings to the recess positioned lengthwise along the first side and a single opening to the recess on the second side, an inlet and an outlet fluidly coupled to the recess, a plurality of plates fastened to the first side enclosing the openings, a heat sink fastened to the second side enclosing the single opening on the second side, and a plurality of fluid cores one of each positioned between each of the plurality of plates and the heat sink. The plurality of fluid cores include a flow distribution insert, a first plate fin positioned between the flow distribution insert and the heat sink fastened to the second side, and a second plate fin positioned between the flow distribution insert and the heat sink.

20 Claims, 16 Drawing Sheets

(58) Field of Classification Search
CPC ............. H05K 7/2039; H05K 7/20763; H05K 7/20927; H05K 7/20218; H05K 7/20781; H01L 23/473; H01L 23/46
See application file for complete search history.

(56) References Cited

U.S. PATENT DOCUMENTS

| | | | |
|---|---|---|---|
| 9,445,526 B2 | 9/2016 | Zhou et al. | |
| 9,980,415 B2 | 5/2018 | Zhou et al. | |
| 10,096,537 B1* | 10/2018 | Chen | F28D 15/0266 |
| 2001/0050162 A1* | 12/2001 | Valenzuela | F28D 15/00 |
| | | | 257/E23.098 |
| 2010/0032147 A1* | 2/2010 | Valenzuela | F28F 3/12 |
| | | | 165/157 |
| 2012/0170222 A1* | 7/2012 | Dede | F28F 3/083 |
| | | | 165/173 |
| 2012/0257354 A1* | 10/2012 | Dede | H01L 23/473 |
| | | | 361/689 |
| 2016/0183409 A1* | 6/2016 | Zhou | H05K 7/20263 |
| | | | 165/104.31 |
| 2016/0242312 A1* | 8/2016 | Singh | H05K 1/181 |
| 2017/0055378 A1* | 2/2017 | Zhou | H05K 7/20927 |
| 2018/0261526 A1* | 9/2018 | Machler | H01L 23/473 |
| 2019/0181717 A1* | 6/2019 | Zhou | H02K 11/33 |
| 2021/0247151 A1* | 8/2021 | Konig | H01L 23/3672 |

OTHER PUBLICATIONS

Brunschwiler, Thomas & Mrossko, R. & Keller, J. & Ozsun, Ozgur & Schlottig, Gerd (2016). Dual-side heat removal by micro-channel cold plate and silicon-interposer with embedded fluid channels. 1-6. 10.1109/ESTC.2016.7764498.

Chen, H. et al. (2017) "Electrified Automotive Powertrain Architecture Using Composite DC-DC Converters." IEEE Transaction on Power Electronics, vol. 32, Issue 1, Jan. 2017.

* cited by examiner

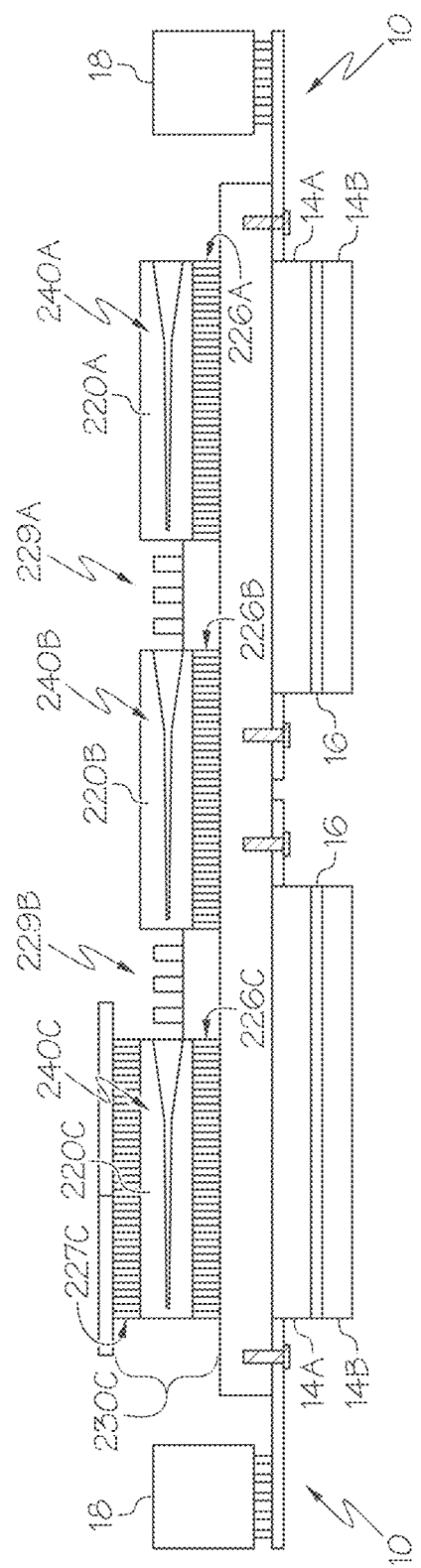

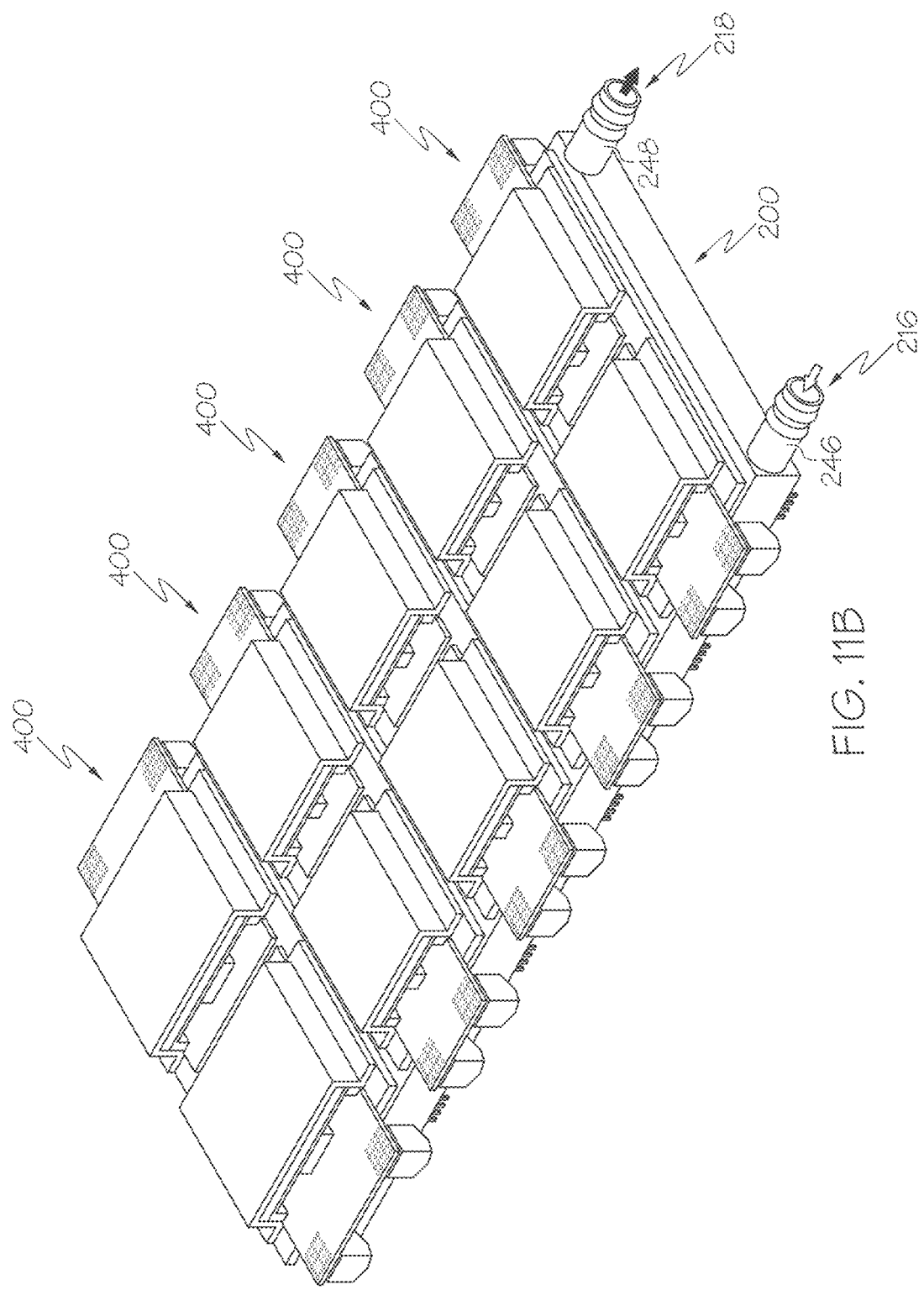

ASYMMETRIC CONFIGURABLE DOUBLE-SIDED MANIFOLD MICRO-CHANNEL COLD PLATES

STATEMENT OF GOVERNMENT INTEREST

The subject matter of the present disclosure was developed with government support under Department of Energy Cooperative Agreement DE-AR0000897 awarded by the U.S. Department of Energy. Accordingly, the government has certain rights in the subject matter of the present disclosure.

TECHNICAL FIELD

The present specification generally relates to double-sided manifold cooling assemblies and, more particularly, to asymmetric configurable double-sided manifold micro-channel cold plates.

BACKGROUND

Heat management devices may be coupled to a heat generation device, such as a power electronics device, to remove heat and lower the operating temperature of the heat generating device. A cooling fluid may be introduced to the heat management device, where it receives heat from the heat management device, primarily through convective and/or conductive heat transfer. The cooling fluid is then removed from the heat management device, thereby removing heat from the heat generating device. In one example, fluid may be directed in a jet in a localized region at a high velocity such that the fluid impinges a surface of the heat management device coupled to the heat generating device. As power electronic devices are designed to operate at increased power levels, the power electronics devices generate an increased corresponding heat flux. The increase in heat flux generated by the power electronics devices may render conventional heat sinks inadequate to reject sufficient heat to maintain a desired operating temperature in the power electronics device. Further, as power electronics modules are incorporated into increasingly compact and variable arrangements, more configurable cooling assemblies are desired.

SUMMARY

In one aspect, a cold plate having a manifold includes a plurality of openings on a first side of the manifold extending through the manifold into a single opening formed in a second side of the manifold, thereby forming a recess within the manifold between the first and second sides, an inlet and outlet channel fluidly coupled to the recess, a plurality of heat sinks enclosing the plurality of openings on the first side, a heat sink enclosing the single opening on the second side, and a plurality of fluid cores, each positioned between each of the plurality of heat sinks and the heat sink. The plurality of fluid cores includes a flow distribution insert, a first plate fin positioned between a first side of the flow distribution insert and a heat sink enclosing one of the plurality of openings on the first side, and a second plate fin positioned between a second side of the flow distribution insert and the heat sink enclosing the single opening, where the flow distribution insert is configured to receive a fluid, divert the received fluid into the first and second plate fins, and receive a return of the fluid from the first and second plate fins.

In another aspect, a cooling manifold system includes a plurality of manifolds fluidly coupled in parallel. At least one manifold of the plurality of manifolds includes a plurality of openings on a first side of the manifold extending through the manifold into a single opening formed in a second side of the manifold, thereby forming a recess within the manifold between the first and second sides, an inlet and outlet channel fluidly coupled to the recess, a plurality of heat sinks enclosing the plurality of openings on the first side, a heat sink enclosing the single opening on the second side, and a plurality of fluid cores, each positioned between each of the plurality of heat sinks and the heat sink. The plurality of fluid cores includes a flow distribution insert, a first plate fin positioned between a first side of the flow distribution insert and a heat sink enclosing one of the plurality of openings on the first side, and a second plate fin positioned between a second side of the flow distribution insert and the heat sink enclosing the single opening, wherein the flow distribution insert is configured to receive a fluid, divert the received fluid into the first and second plate fins, and receive a return of the fluid from the first and second plate fins.

In yet another aspect, an electronic system, includes a cold plate having a manifold having a plurality of openings on a first side of the manifold extending through the manifold into a single opening formed in a second side of the manifold, thereby forming a recess within the manifold between the first and second sides, an inlet and outlet channel fluidly coupled to the recess, a plurality of heat sinks enclosing the plurality of openings on the first side, a heat sink enclosing the single opening on the second side, and a plurality of fluid cores, each positioned between each of the plurality of heat sinks and the heat sink. The plurality of fluid cores includes a flow distribution insert, a first plate fin positioned between a first side of the flow distribution insert and a heat sink enclosing one of the plurality of openings on the first side, and a second plate fin positioned between a second side of the flow distribution insert and the heat sink enclosing the single opening, wherein the flow distribution insert is configured to receive a fluid, divert the received fluid into the first and second plate fins, and receive a return of the fluid from the first and second plate fins. The electronics system further includes a power electronics printed circuit board coupled to the heat sink and a power module coupled to one of the plurality of heat sinks.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 6E schematically depicts a perspective view of a partially assembled internal structure of the double-sided multi-modular manifold cooling assembly coupled to a power electronics printed circuit board according to one or more embodiments shown and described herein;

FIG. 11B schematically depicts a bottom perspective view of a cooling manifold system having a plurality of double-sided cold plate assemblies according to one or more embodiments shown and described herein;

DETAILED DESCRIPTION

Embodiments of the present disclosure include a configurable, double-sided cold plate for cooling power electronic components and multiple power modules. The cold plate may include a single, relatively larger heat sink on one side of the manifold and a plurality of modular, relatively smaller heat sinks on the other side of the manifold to facilitate cooling of large and small electronic packages. As described in more detail herein, a compact heat sink design can be more desirable for cooling high power density power electronics. Accordingly, the present disclosure depicts and describes embodiments of a cold plate that includes a manifold that delivers a fluid to a plurality of fluid cores that distribute the fluid to opposing sides of the manifold that include heat sinks sized to accommodate the power electronic device attached thereto. By implementing heat sinks that are sized to correspond to the foot print of the power electronic devices that are intended to be cooled by the cold plate assembly, the components of different sizes and heat loads may be cooled by the same cold plate assembly. For example, power modules and/or capacitors may be coupled to a first side of the cold plate and power electronic printed circuit boards (PCBs) may be coupled to a second side of the cold plate.

As described in more detail herein, the first side of the manifold of the cold plate includes a plurality of openings each having a fluid core, which may also be referred to as a cooling cell, that are configured in parallel or series within the manifold to accommodate different electronic components and heat loads. The plurality of openings may be enclosed with a modular heat sink that is thermally coupled to the fluid core configured within a recess of the manifold. The second side that is opposite the first side of the manifold includes a single opening to the recess in the manifold that is shared with the plurality of openings on the first side. The single opening is enclosed with a heat sink that is fluidly coupled to the fluid core.

Additionally, multiple cold plates may be fluidly coupled together to form a cooling system. Such configurations and other aspects of the present disclosure will be depicted and described herein. Turning now to the figures, FIGS. 1A-1C depict various illustrative example power electronic components and assemblies that may be coupled to the cold plate for cooling.

Figure 1A:
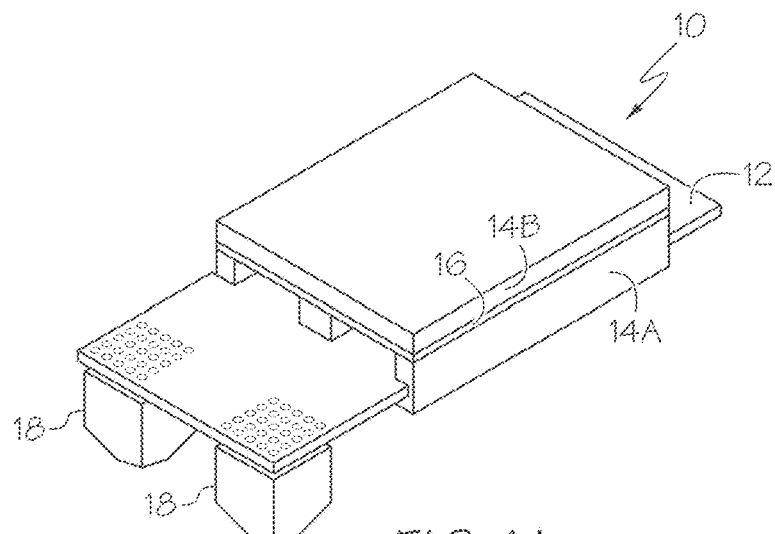
FIG. 1A schematically depicts a perspective view of an inductor for a booster and buck booster according to one or more embodiments shown and described herein.
Figure 1B:
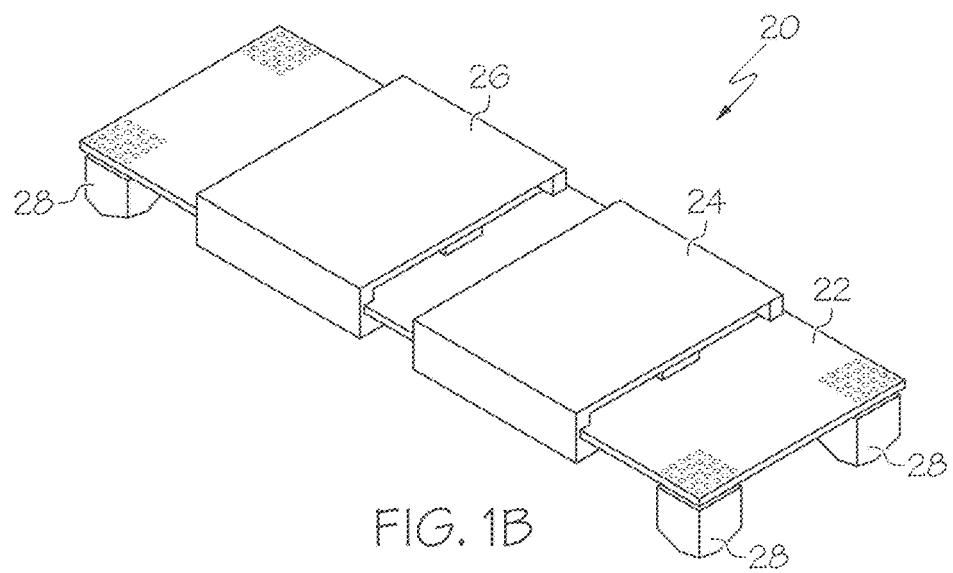
FIG. 1B schematically depicts a perspective view of an inductor for a DC-DC transformer according to one or more embodiments shown and described herein.
Figure 1C:
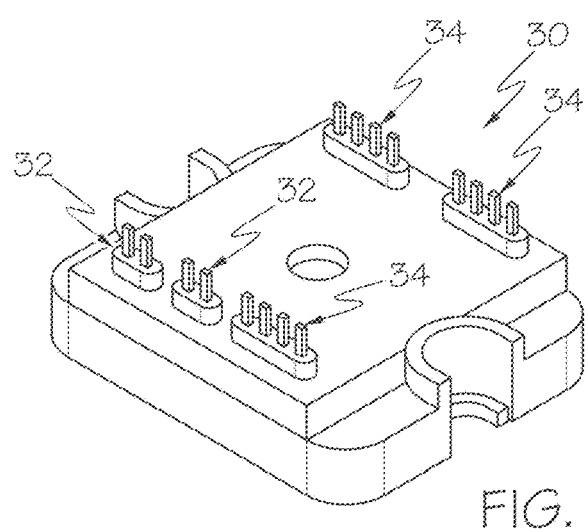
FIG. 1C schematically depicts a perspective view of an illustrative power module according to one or more embodiments shown and described herein.

In particular, an illustrative example of an inductor for a booster and buck booster is depicted in FIG. 1A. For example, a power electronic PCB 10 may be configured as an inductor. When inductors are energized, heat is generated by the coil and core of the inductor. That is, for example, a changing magnetic field can induce circulating loops of electric current in the conductive metal core. The energy in these currents is dissipated as heat in the resistance of the core material. The amount of energy lost increases with the area inside the loop of current. As depicted, power electronic PCB 10 includes an embedded coil with the PCB 12 material that is enclosed by a core 14A, 14B, which channels the magnetic field generated by the electrical current flowing through the embedded coil. The coil may also be a surface mounted coil coupled to a surface of the PCB 12 material. Furthermore, it should be understood that the planar type inductor is merely on example of an inductor and that other configurations may be implemented in power electronic configurations.

Figure 8:
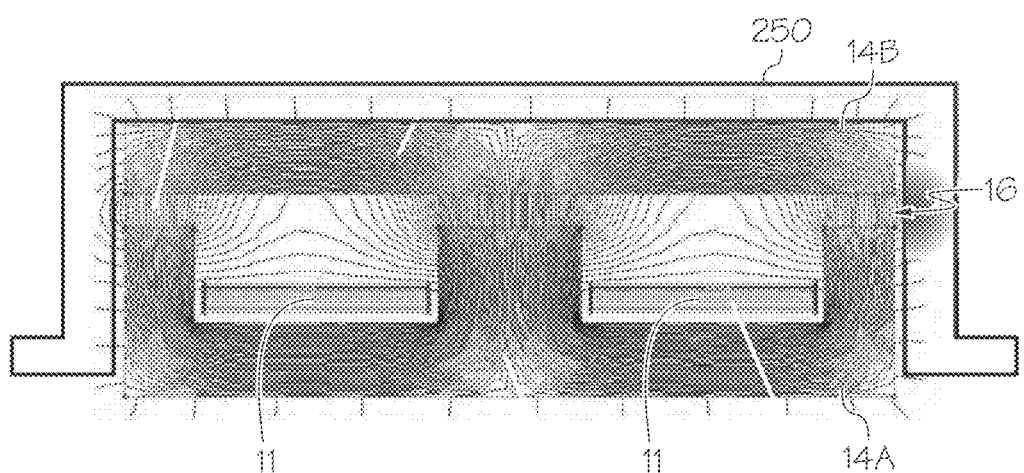
FIG. 8 schematically depicts a cross-sectional side view of an inductor core and the magnetic field generated by the inductor according to one or more embodiments shown and described herein.

The core may be made up of two parts, an "E" shaped portion 14A and an "I" shaped portion 14B that, when mated or brought into close contact with each other, provide magnetic field loops that operate to channel the magnetic field generated by the planar coil loop within the PCB 12. For example, the center leg of the "E" shape portion is positioned such that the planar coil loop encircles the center leg while the outside two legs of the "E" shaped portion extend around the outside of the planar coil loop. An example of the magnetic field generated and channeled by the core is depicted in FIG. 8, which will be discussed in more detail herein with reference to managing heat generated within a metal enclosure that operates to attach the core of the securely to the power electronic PCB 10 and/or the cold plate. Still referring to FIG. 1A, a secure connection helps increase the heat transfer efficiency from the core to the heat sink of the cold plate. In some embodiments, the core may include an insulation layer 16 positioned between the "E" shaped portion 14A and the "I" shaped portion 14B of the core. It should be understood that an EI type core is only one example core configuration that may be implemented to form an inductor core.

The power electronic PCB 10 also includes connectors 18. The connectors 18 are conductive connectors configured to electrically connect the inductor and/or other components of the power electronic PCB 10 to other components of a power system. The power system may be an electric vehicle powertrain, a motor inverter, a bi-directional DC-DC converter, or the like. FIG. 1B depicts another example power electronic PCB 20. The example power electronic PCB 20 includes an inductor for a DC-DC converter. The power electronic PCB 20 may include one or more coils embedded or coupled to the PCB 22 material of the power electronic PCB 20. Cores 24 and 26 enclose the one or more coils to channel and/or amplify the magnetic field generated by electric current flowing through the one or more coils. Additionally, the power electronic PCB 20 also includes connectors 28. The connectors 28 are conductive connectors configured to electrically connect the inductor and/or other components of the power electronic PCB 20 to other components of a power system.

The power electronic PCBs 10 and 20 depicted in FIGS. 1A and 1B are examples of larger components that may be implemented in a power system and require cooling. The power system may also include power modules, such as the power module 30 depicted in FIG. 1C. The power module 30 may include power devices including switching components such as field-effect transistors (FETs) or the like. The power module 30 may operate as a control module for the electric vehicle powertrain, the motor inverter, the bi-directional DC-DC converter, or the like, for example. Accordingly, the power module 30 includes signal connectors 32 and power connectors 34. The signal connectors 32 and power connectors 34 may be electrically coupled to other power modules 30 or power components such as a planar inductor, capacitor or the like.

It should be understood that the aforementioned and described power components are a few examples of components implemented in power systems that may require cooling to operate at high voltages and currents. To deliver compact power systems such as those for use in automotive applications it is advantageous to combine thermal management into modular cooling systems such as those described herein. However, since the size and heat management requirements for components of a power system vary, a modular cooling system that is asymmetric and configurable is needed. The asymmetry of the cooling system refers to the ability to manage large and small component with the same manifold or different sides of the cold plate as described herein while also providing an efficient means for electrically connecting the components.

FIGS. 2, 3A-3C, and 4A-4C depict an illustrative double-sided cold plate 100. The structure and operation of the double-sided cold plate 100 described with reference to FIGS. 2, 3A-3C, and 4A-4C is then incorporated into an asymmetric configurable double-sided manifold cooling assembly that is depicted and described with reference to FIGS. 5-14.

Figure 2:
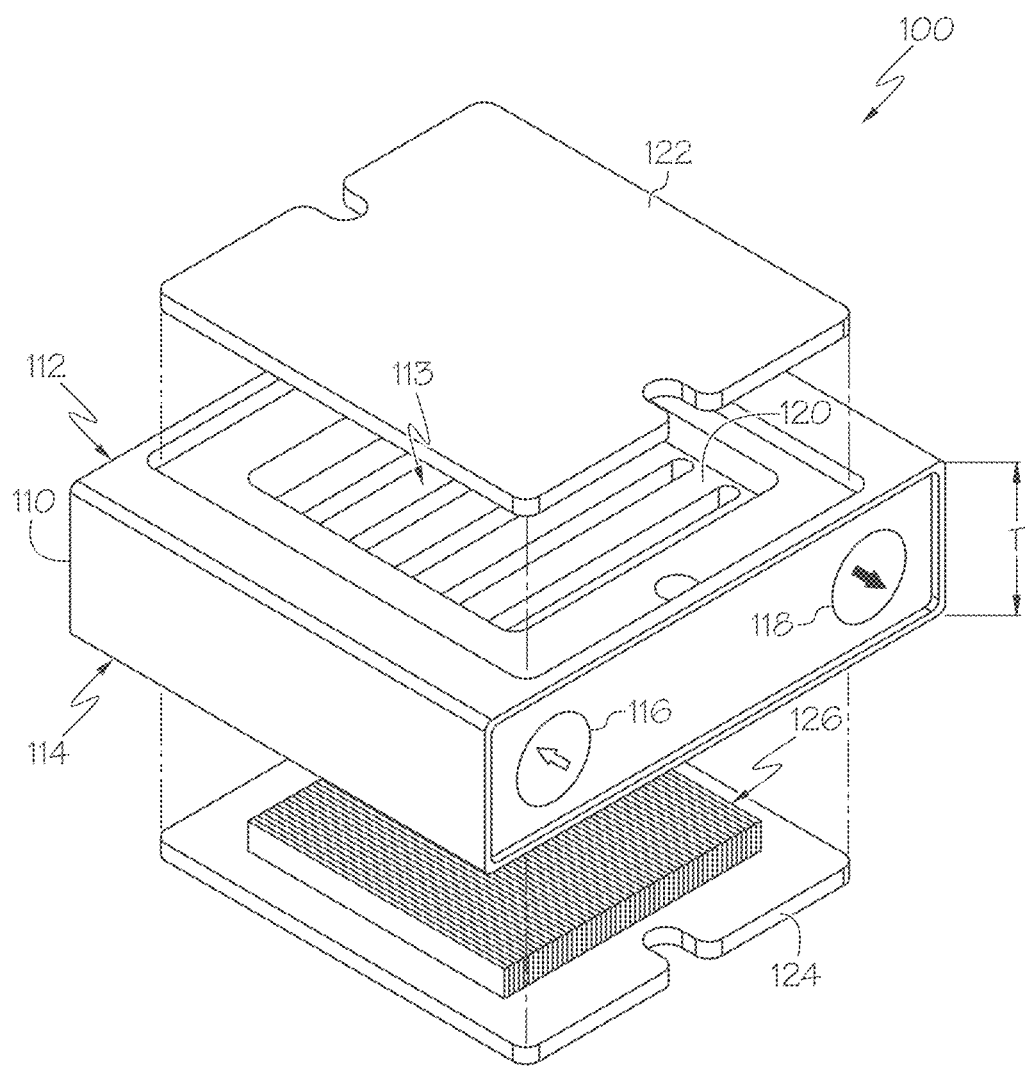
FIG. 2 schematically depicts an exploded perspective view of a double-sided cold plate assembly according to one or more embodiments shown and described herein.

Referring to FIG. 2, the double-sided cold plate 100, as depicted, includes a manifold 110 that has a first side 112 (also referred to herein as the top surface) and a second side 114 (also referred to herein as the bottom surface) that is spaced apart from the first side 112 by a thickness of material making up the manifold. The manifold 110 may be made of non-conductive material such as a plastic, a ceramic, or a composite material. A recess 113 is formed within the manifold 110. The recess 113 within the manifold 110 may include an opening in the first side 112 and an opening in the second side 114. The openings, as described in more detail herein, may be enclosed by one or more heat sinks 122 and 124 that provide a thermal conductive surface for coupling a component that is intended to be cooled thereto.

The manifold 110 includes an inlet channel 116 and an outlet channel 118. The inlet channel 116 is configured to receive a cooling fluid. The inlet channel 116 is fluidly connected to the recess 113 of the manifold 110. The outlet channel 118 is configured to receive the cooling fluid from the recess 113 and expel the cooling fluid from the manifold 110. The flow of the cooling fluid between being delivered to the recess 113 and being dispensed from the recess 113 will be described in more detail herein. In some embodiments, the inlet channel 116 and the outlet channel 118 extend through the manifold 110. Such embodiments enable multiple manifolds 110 to be fluidly coupled together as described in more detail herein.

Figure 4A:
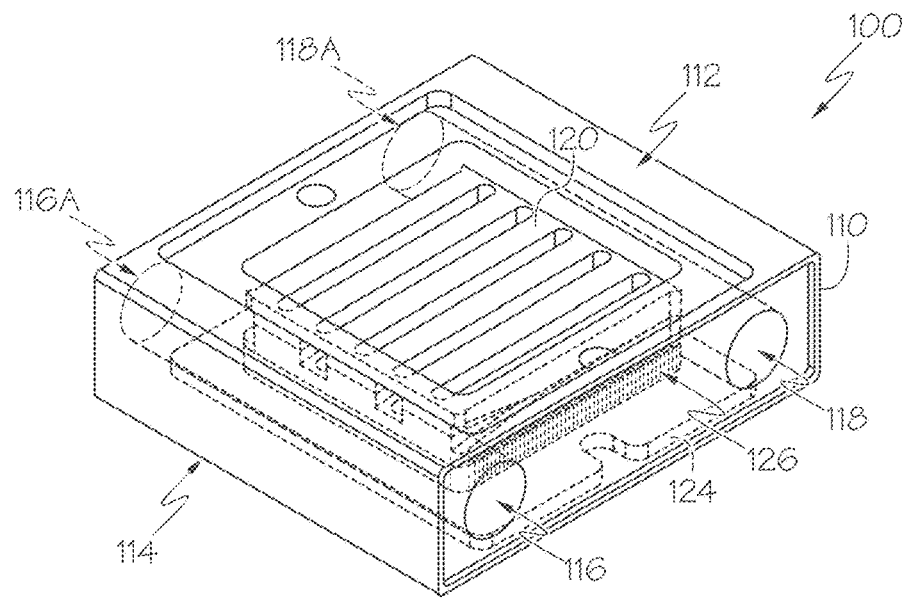
FIG. 4A schematically depicts a perspective view of a partially assembled manifold according to one or more embodiments shown and described herein.
Figure 4B:
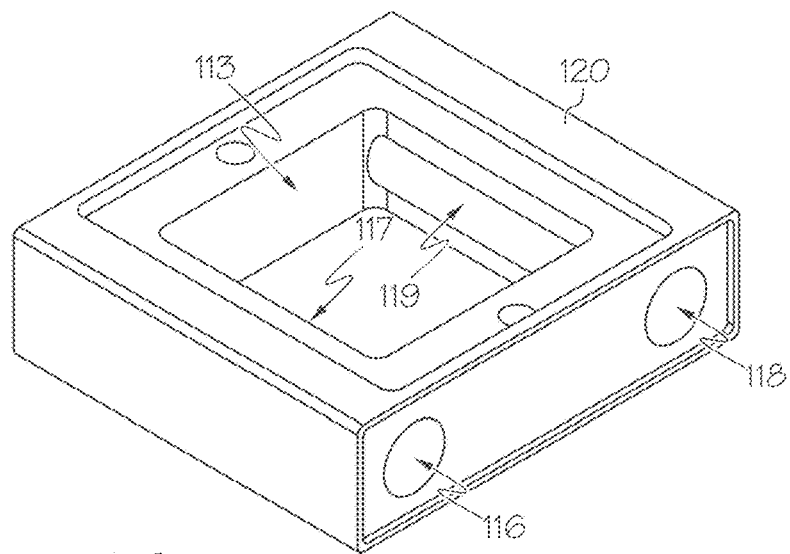
FIG. 4B schematically depicts a perspective view of the manifold without the fluid core assembled therein according to one or more embodiments shown and described herein.
Figure 4C:
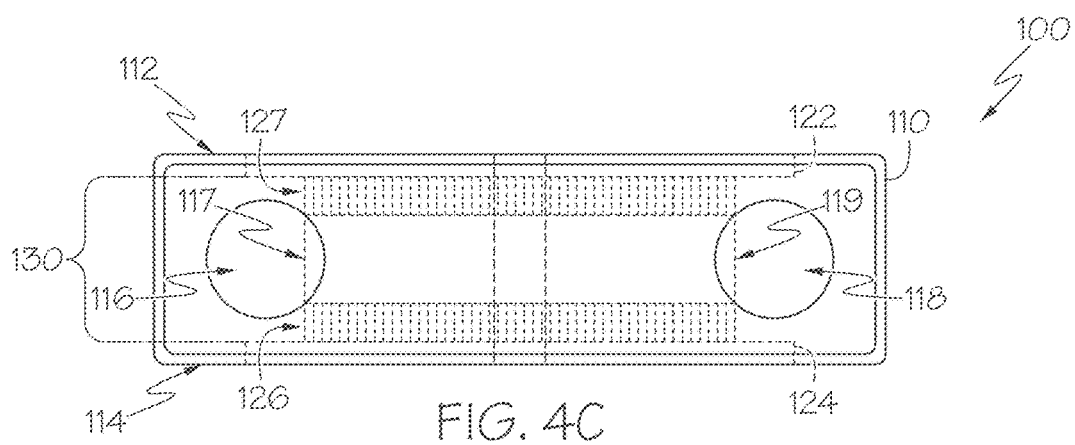
FIG. 4C schematically depicts a side view of an assembled manifold according to one or more embodiments shown and described herein.

The manifold 110 further includes a fluid core 130 (FIG. 4C). The fluid core 130 may also be referred to as a manifold micro-channel (MMC) fluid core as the fluid core may include a plurality of micro-channel formed as part of the heat sinks 122 and/or 124. The fluid core 130 includes a flow distribution insert 120 and plate fins 126 and 127 positioned on opposite sides of the flow distribution insert 120. For example, a first plate fin 127 (not shown in FIG. 2 but depicted in FIG. 4C) is positioned between the heat sink 122 and the flow distribution insert 120. The second plate fin 126 is positioned between the heat sink 124 and the flow distribution insert 120. The plate fins 126 and 127 may include a plurality of micro-channels that are defined by spaces between plates. The plurality of micro-channels enables heat to be transferred from the plates to cooling fluid that flows therebetween. However, it should be understood that embodiments are not limited to plate fins 126 and 127. That is, other types of heat exchangers such as pin fins, porous wick structures, or the like may be implemented to facilitate the transfer of heat from electronic devices coupled to the heat sinks 122 and 124 to the cooling fluid flowing through the manifold 110. Furthermore, in some embodiments, the heat sink 122 and/or 124 and the plate fins 126 and 127 are formed as a single component although the heat sink 122 and 124 and the plate fins 126 and 127 are described in some embodiments as separate components.

Figure 3A:
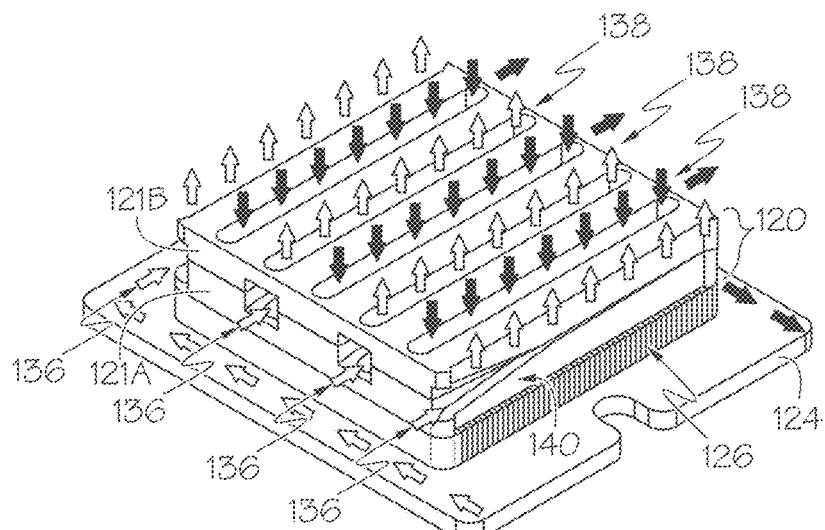
FIG. 3A schematically depicts a perspective view of a fluid core for the manifold according to one or more embodiments shown and described herein.
Figure 3B:
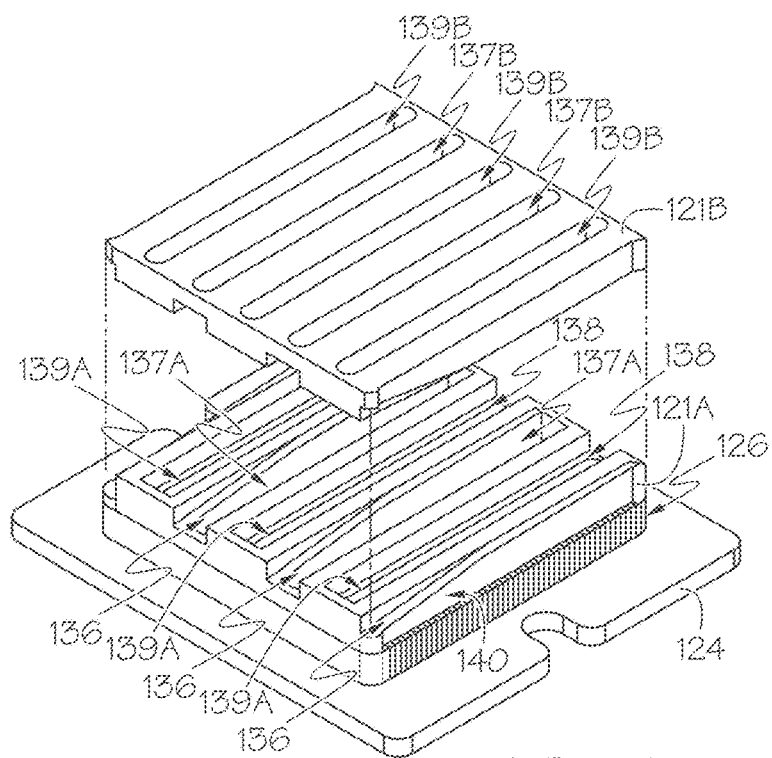
FIG. 3B schematically depicts an exploded perspective view of a flow distribution insert of the fluid core for the manifold according to one or more embodiments shown and described herein.
Figure 3C:
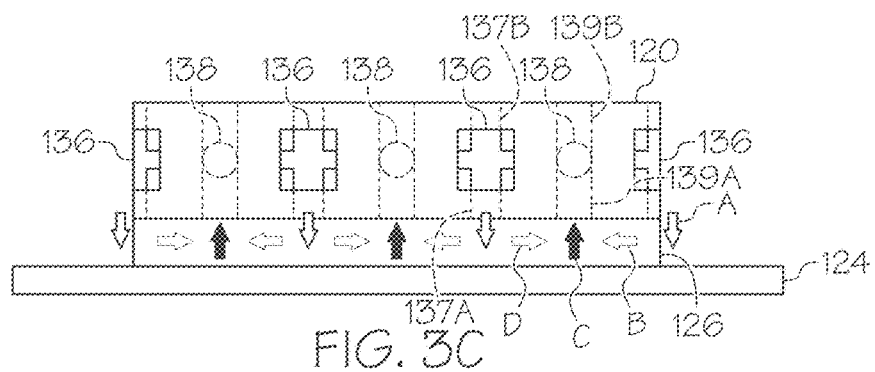
FIG. 3C schematically depicts a side view of the fluid core for the manifold according to one or more embodiments shown and described herein.

Turning to FIGS. 3A-3C, the fluid core 130 and the flow of cooling fluid there through is depicted and described in detail. FIG. 3A depicts a perspective view of a portion of the fluid core 130 with arrows depicting the flow of cooling fluid. As described above, the fluid core 130 is fluidly coupled to the inlet channel 116 and the outlet channel 118. In particular, the inlet channel 116 is fluidly coupled to one or more inlet connection tubes 136 of the flow distribution insert 120. Cooling fluid supplied through the inlet channel 116 enters the one or more inlet connection tubes 136 and is diverted into the first and second plate fins 126 and 127.

The flow distribution insert 120 may have a top portion 121B and a bottom portion 121A that are coupled together to form inlet connection tubes 136 and outlet connection tubes 138. The flow distribution insert 120 includes a first opening 137A (FIG. 3B) along the length of the inlet connection tube 136. The first opening 137A along the length of the inlet connection tube 136 is configured to divert a portion of the cooling fluid into the first plate fin 127. The flow distribution insert 120 includes a second opening 137B (FIG. 3B) along the length of the inlet connection tube 136. The second opening 137B along the length of the inlet connection tube 136 is configured to divert a portion of the cooling fluid into the second plate fin 126.

Turning to FIG. 3B, an exploded perspective view of a flow distribution insert 120 of the fluid core 130 to the manifold 110 is depicted. As depicted, in some embodiments, the cross-sectional area of the inlet connection tube 136 decreases as the tube extends into the flow distribution insert 120. For example, the inlet connection tube 136 may include a tapered portion 140 that extends from the entry of the inlet connection tube 136 inward causing the cross-sectional area of the inlet connection tube 136 to decrease along the length of the inlet connection tube 136. In some embodiments, the outlet connection tube 138 may be similarly configured as the inlet connection tube 136. The decreasing cross-sectional area causes cooling fluid to be more uniformly forced out of the first and/or second openings 137A and 137B along the length of the inlet connection tube 136. In other words, the decreasing cross-sectional area of the inlet connection tube 136 enables a predefined pressure to be applied to the cooling fluid so that the cooling fluid is expelled from the inlet connection tube 136 into the plurality of micro-channels of the plate fins 126 and 127 uniformly.

Turning to FIG. 3C, a side view of a portion of the fluid core 130 is depicted. As the cooling fluid expelled from the first and/or second openings 137A and 137B along the length of the inlet connection tube 136, as indicated by the down arrows A in FIG. 3C the cooling fluid flows through the micro-channels of the first and/or second plate fins 126 and 127 as depicted by arrows B and D. The cooling fluid returns into the flow distribution insert 120 through first and/or second openings 139A and 139B along the length of the outlet connection tube 138 as indicated for example by arrows C in FIG. 3C. It is noted that the micro-channels of the plate fins 126 and 127 may be oriented in a perpendicular direction with respect to the inlet connection tubes 136 and the outlet connection tubes 138.

Once the cooling fluid returns to the flow distribution insert 120 the cooling fluid, which has extracted heat from the plate fins 126 and 127, flows out of the flow distribution insert 120 into the outlet channel 118 and subsequently out of the manifold 110. In some embodiments, the cooling fluid may be pumped through a condenser or other cooling device before being returned to the manifold 110.

Referring now to FIGS. 4A-4C, additional perspective views of the cold plate 100 are depicted. Turning to FIG. 4A, an assembled view of the cold plate 100 having a manifold 110 is depicted. In particular, the components of the fluid core 130 are depicted in dashed lines illustrating the assembly of the components. The inlet channel 116 is also depicted as extending through the manifold 110 and having an exit 116A that may be used to fluidly couple a first manifold to a second manifold. Similarly, outlet channel 118 is depicted as extending through the manifold 110 and having an exit 118A that may be used to fluidly couple a first manifold to a second manifold.

Referring to FIG. 4B, the components of the fluid core 130 are not depicted so that an opening 119 in the outlet channel 118 that fluidly couples the recess 113 to the outlet channel 118 may be visualized. That is, instead of having additional connection tubes between the recess 113 and the outlet channel 118, the outlet channel 118 of the manifold 110 is fluidly coupled directly to the recess 113. In a similar fashion, although not specifically visualized, the inlet channel 116 includes an opening 117 that directly fluidly couples the inlet channel 116 with the recess 113 is included in the manifold 110.

In FIG. 4C, a cross-sectional side view of the cold plate 100 and manifold 110 in its assembled state is depicted. Here, the openings 117 and 119 in the inlet channel 116 and the outlet channel 118, respectively, are fluidly coupled directly to the flow distribution insert 120 that is installed in the recess 113 of the manifold 110. Moreover, the first plate fin 127 and the second plate fin 126 are illustrated in their installed positions on the top and bottom sides of the flow distribution insert 120. A first heat sink 122 is installed adjacent to the first plate fin 127 such that heat collected by the first heat sink 122 may be transferred to the plates of the first plate fin 127 and subsequently extracted when cooling fluid flows through the micro-channels of the first plate fin 127. In a similar manner, a second heat sink 124 is installed adjacent to the second plate fin 126 such that heat collected by the second heat sink 124 may be transferred to the plates of the second plate fin 126 and subsequently extracted when cooling fluid flows through the micro-channels of the second plate fin 126. As will be described in more detail with reference to FIGS. 5-14, the first side 112 and the second side 114 of the cooling manifold are structured to accommodate different power electronic components and extract heat therefrom. It should now be understood how a fluid core 130 having a flow distribution insert 120 fluidly coupled to plate fins 126 and 127 operates to extract heat collected by heat sinks 122 and 124 attached to the first and second sides 112 and 114 of the manifold 110. Principles of the fluid core 130 will now be implemented and described with reference to asymmetric configurable double-sided manifold cooling assemblies.

Turning now to FIGS. 5-14, aspects of an asymmetric configurable double-sided cold plate 200 having a manifold 210, a plurality of fluid cores 230 and power electronic assemblies coupled thereto will be described. The asymmetric configurable double-sided cold plate 200 depicted in FIG. 5 includes a manifold 210 having a first side 212 and a second side 214 opposite the first side and separated by a thickness T of the manifold 210.

Figure 9:
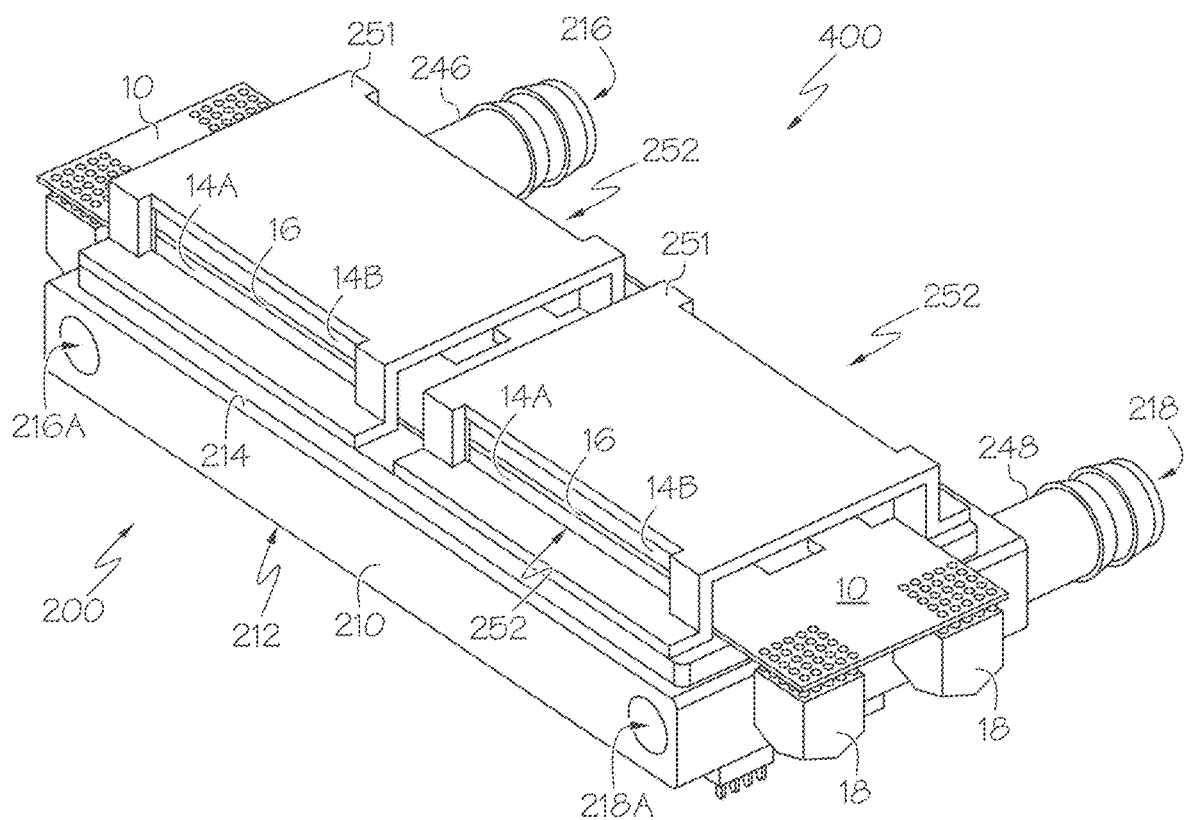
FIG. 9 schematically depicts a perspective view of double-sided manifold cooling assembly according to one or more embodiments shown and described herein.

The manifold 210 further includes an inlet channel 216 and an outlet channel 218. The inlet channel 216 may extend through the manifold 210 from a front side to a rear side (e.g., to opening 216A as shown in FIG. 9) to fluidly couple to another manifold. The outlet channel 218 may extend through the manifold 210 from a front side to a rear side (e.g., to opening 218A as shown in FIG. 9) to fluidly couple to another manifold. Additionally, the inlet channel 216 includes one or more openings 217 configured along its length that directly fluidly couple the inlet channel 216 with the recess 213 and the fluid management components therein. Similarly, although not illustrated in FIG. 5, the outlet channel 218 includes one or more openings 219 configured along its length that directly fluidly couple the outlet channel 218 with the recess 213 and the fluid management components therein.

Figure 5:
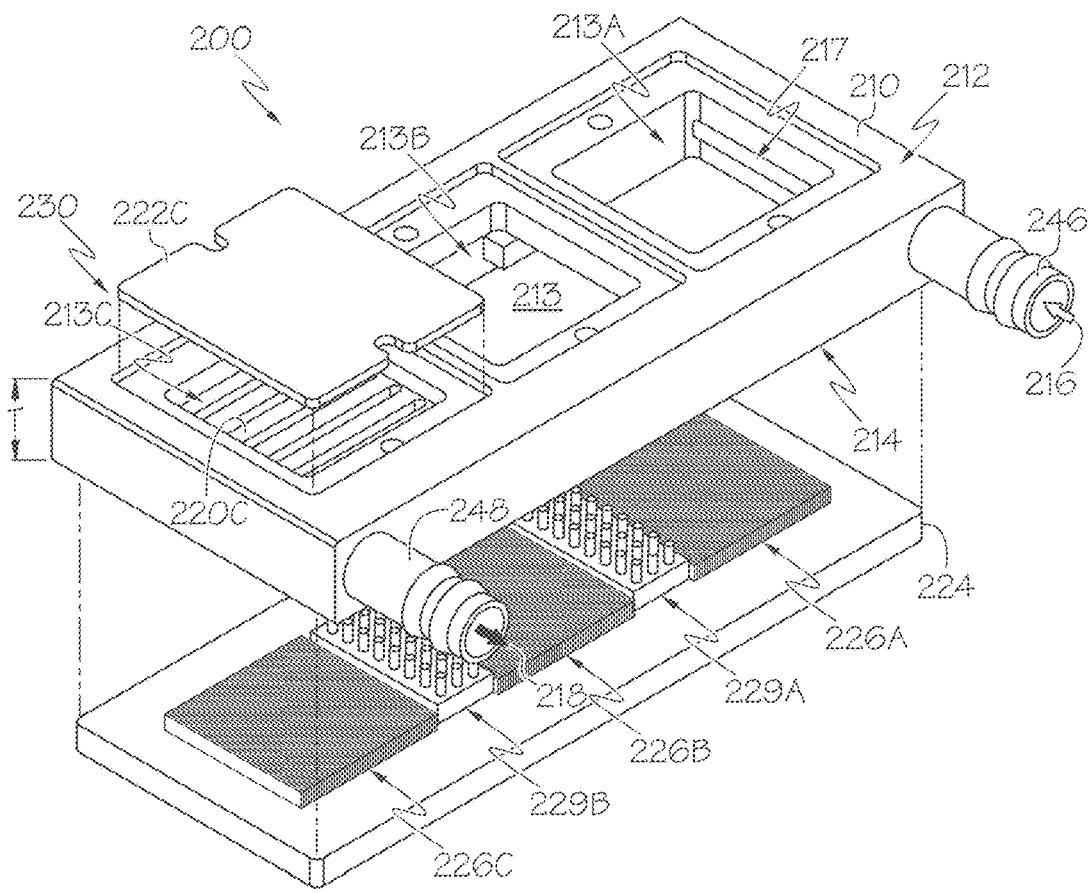
FIG. 5 schematically depicts an exploded perspective view of a double-sided multi-modular manifold cooling assembly according to one or more embodiments shown and described herein.

In FIG. 5, the inlet channel 216 further includes an inlet connection port 246, however, in some embodiments, the inlet connection port 246 is not needed. Additionally, the outlet channel 218 further includes an outlet connection port 248, however, in some embodiments, the outlet connection port 248 is not needed. For example, the inlet connection port 246 and the outlet connection port 248 may not be required when two manifolds 210 are connected to each other in a parallel configuration as depicted for example in FIG. 11A.

The first side 212 of the manifold 210 includes three openings 213A, 213B, and 213C that extend through the manifold 210 forming a recess 213 therein. The second side 214, which is described in more detail with reference to FIG. 6B, includes a single opening 215. The openings 213A, 213B, and 213C on the first side 212 of the manifold 210 are enclosed by a plurality of modular heat sinks 222C. Heat sinks 222A and 222B are not depicted in FIG. 5, but they would enclose openings 213A and 213B, respectively. They are absent so that other features of the manifold 210 may be clearly depicted.

The manifold 210 further includes a plurality of fluid cores 230, each of which correspond to an opening in the first side 212 of the manifold 210. As described above, a fluid core 230C includes a flow distribution insert 220C and plate fins 226C (collectively 226) and 227C (collectively 227) disposed on opposing sides of the flow distribution insert 220C. Plate fins 224A, 224B, 226A, and 226B and flow distribution inserts 220A and 220B are not depicted in FIG. 5, but they would be installed within the recess 213 corresponding to openings 213A and 213B, respectively.

Referring to the second side 214 of the manifold 210, a heat sink 224 may be configured to enclose the single opening 215 (FIG. 6B) in the second side 214 of the manifold 210. The heat sink 224 may be fastened to the manifold 210. The heat sink 224 is coupled to or formed with one or more heat exchangers such as plate fins 226A, 226B, and 226C and pin fins 229A and 229B. The heat sink 224 may be bonded to the manifold 210 by plastic-metal direct bond. By doing so, the volume required for bolts and nuts needed in conventional systems can be saved. Accordingly, a more compact system is achievable through embodiments described herein. The plate fins 226A, 226B, and 226C correspond to the fluid cores 230A, 230B, and 230C (collectively 230) for each of the openings 213A, 213B, and 213C in the first side 212. The pin fins 229A and 229B may be installed between the outlet connection tubes 238A of a first flow distribution insert 220A and the inlet connection tubes 236B of a second flow distribution insert 220B so that the heat sink 224, which is configured to accommodate lager components for cooling that the plurality of modular heat sinks 222A, 222B, and 222C, may be further cooled. That is, the pin fins 229A and 229B offer additional heat dissipation and interaction with the cooling fluid as it flows from one flow distribution insert 220A to another flow distribution insert 220B.

Figure 6A:
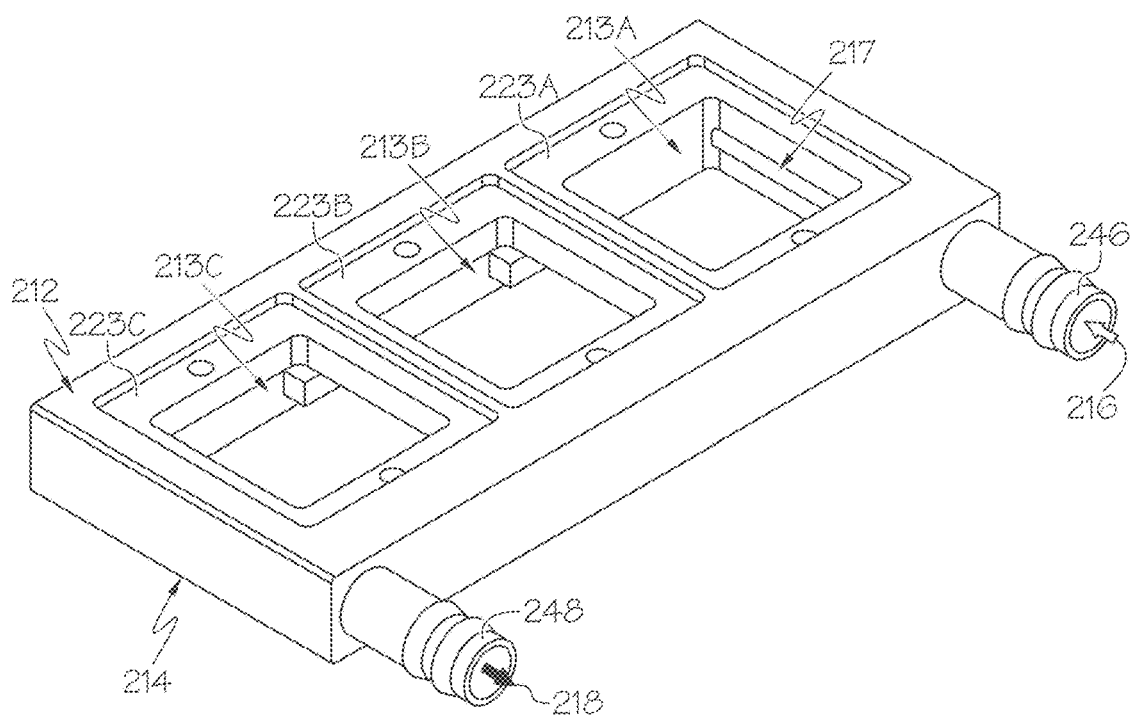
FIG. 6A schematically depicts a top perspective view of the multi-modular manifold shown in FIG. 5 according to one or more embodiments shown and described herein.
Figure 6B:
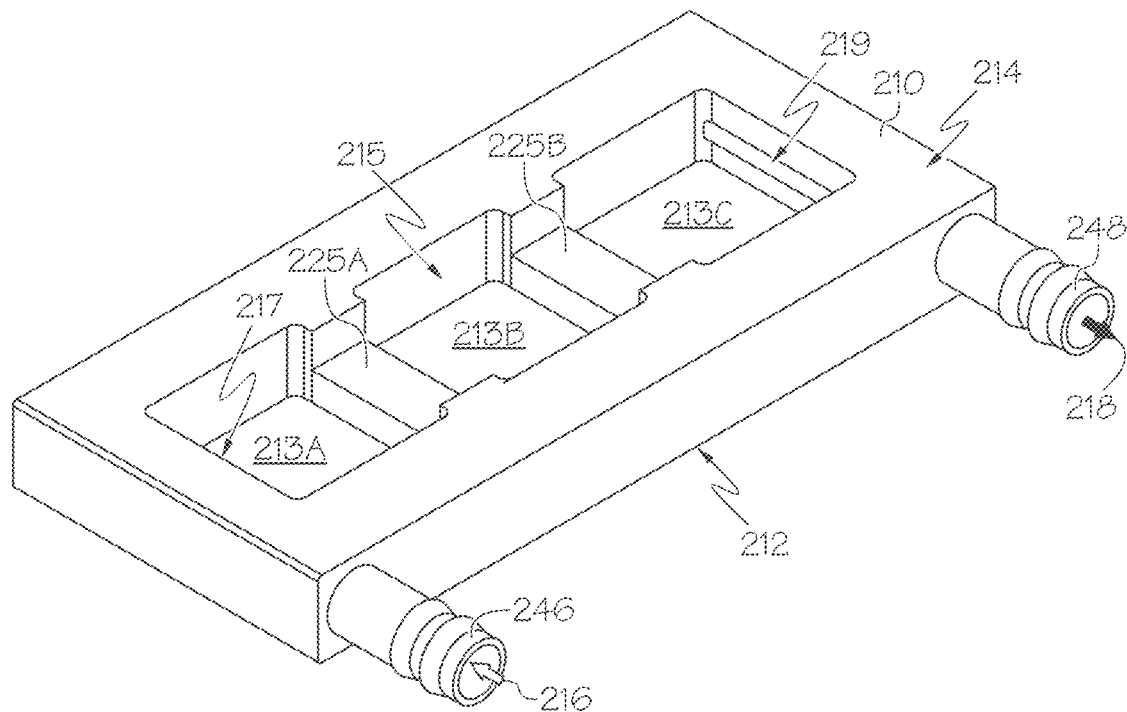
FIG. 6B schematically depicts a bottom perspective view of the multi-modular manifold shown in FIG. 5 according to one or more embodiments shown and described herein.

Referring to FIGS. 6A and 6B, additional illustrations of the asymmetric manifold 210 are depicted. For example, FIG. 6A depicts a top perspective view of the manifold 210. As shown, the first side 212 of the manifold 210 includes three openings 213A, 213B, and 213C into the recess 213 of the manifold 210. While the manifold 210 depicted in FIG. 6A includes three openings 213A, 213B, and 213C, it is understood that the manifold 210 may have more or fewer openings to accommodate different electronic components of an electronic system for cooling. Furthermore, FIG. 6B depicts a bottom perspective view of the manifold 210. The second side 214 of the manifold 210 includes a single opening 215 into the recess 213. Additionally, the three openings 213A, 213B, and 213C are sub-divided by cross-members 225A and 225B, which extend only a portion of the way into the recess 213 from the first side 212 toward the second side 214. By only extending a portion of the way into the recess 213, pin fins 229A and 229B, as shown in FIG. 5 may be incorporated between the plate fins 226A, 226B, and 226C so that the heat sink 224 may be further cooled as the cooling fluid flows from one flow distribution insert to another.

Figure 6C:
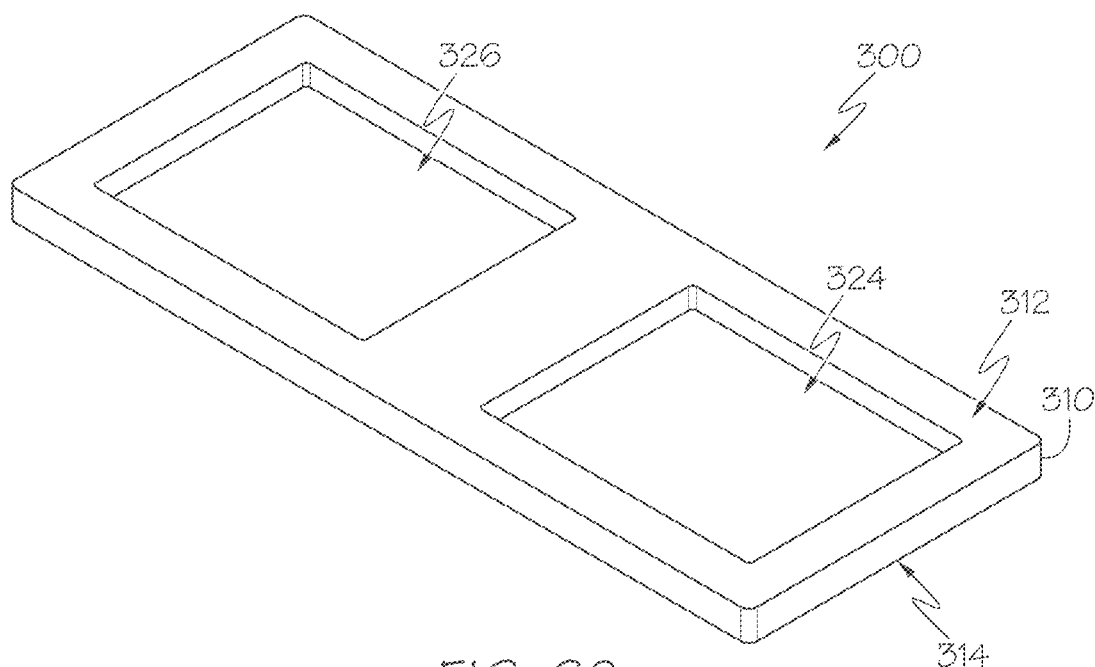
FIG. 6C schematically depicts an example heat sink configured to fasten to the second side of the multi-modular manifold shown in FIG. 5 according to one or more embodiments shown and described herein.

Referring to FIG. 6C, an illustrative example of a heat sink 300 is depicted. For example, the heat sink 300, which may be installed in place of a solid heat sink 224 as depicted in FIG. 5, may include a frame 310 having openings 324 and 326. The openings 324 and 326 may extend from the top surface 312 to the bottom surface 314 as shown in FIG. 6C. However, in some embodiments, the openings may only extend a portion of the way through the thickness of the frame 310 from either the top surface 312 or the bottom surface 314. The openings 324 and 326 are configured to receive portions of electronic components attached installed adjacent to the second side of the manifold 210 for cooling. For example, the openings 324 and 326 may correspond to the core of a planar inductor. By including openings that extend all or a part of the way through the heat sink 300, the heat generated by the component intended to be cooled may be brought into closer contact with pin fins 229A and 229B and/or the plate fins 226A, 226B, and 226C to improve the efficiency of transferring heat away from the component.

Figure 6D:
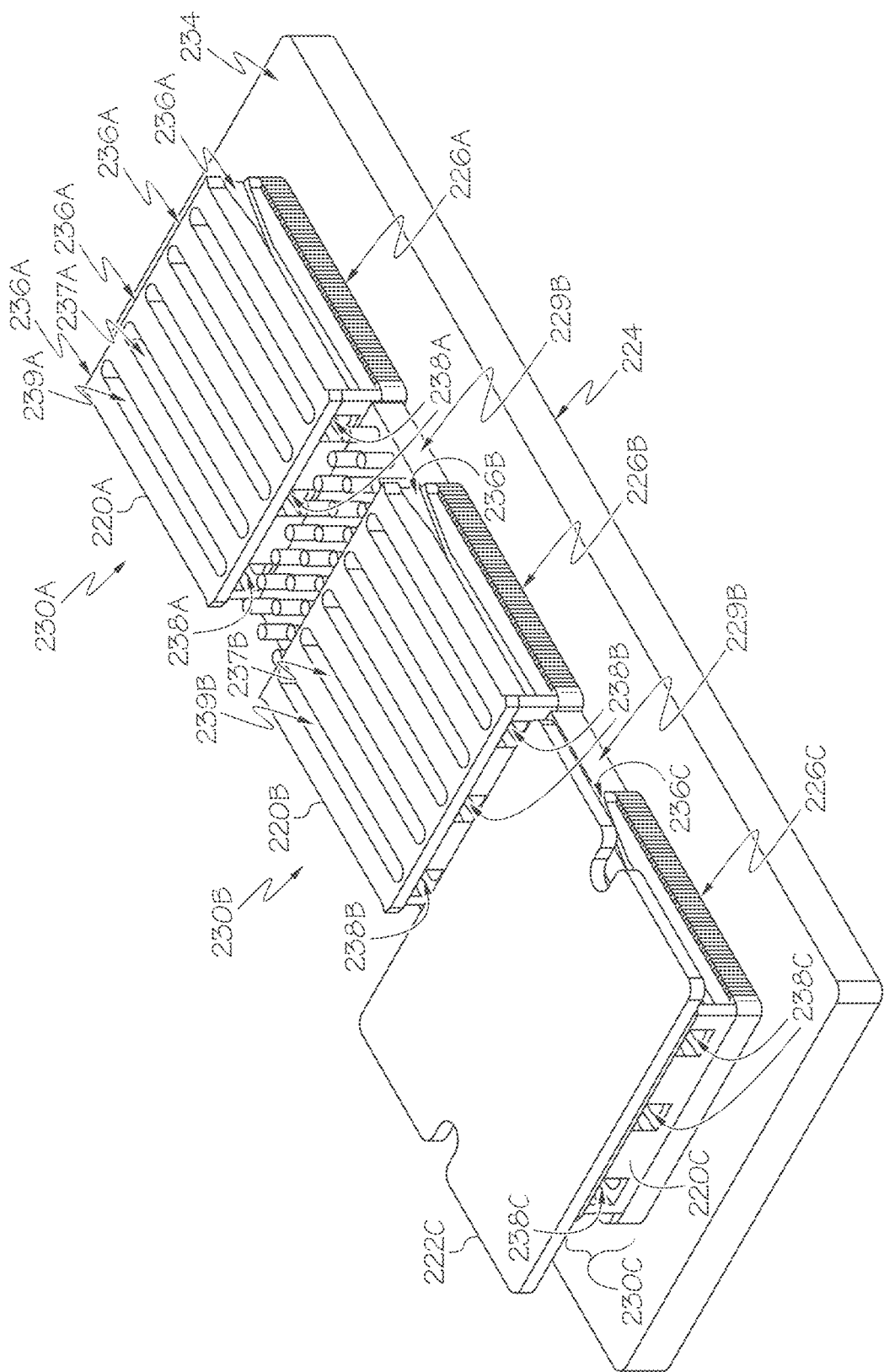
FIG. 6D schematically depicts a perspective view of a partially assembled internal structure of the double-sided multi-modular manifold cooling assembly according to one or more embodiments shown and described herein.

Referring now to FIG. 6D, a perspective view of a partially assembled internal structure of the manifold 210, the fluid core 230, is depicted. In operation, the flow distribution insert 220A receives cooling fluid from the opening 217 in the inlet channel 216. The cooling fluid enters the flow distribution insert 220A through the inlet connection tubes 236A. The flow distribution insert 220A diverts cooling fluid toward the first side 212 and second side 214 of the manifold 210 through openings 237A along the length of inlet connection tubes 236A. This diversion of cooling fluid introduces cooling fluid into the plate fins 226A and 227A. As previously depicted and described with reference to FIG. 3C, the cooling fluid flow through the micro-channels of the plate fins 226A and 227A and returns to the flow distribution insert 220A via the openings 239A along the length of the outlet connection tubes 238A. The cooling fluid then flows out the outlet connection tubes 238A of the first flow distribution insert 220A and optionally through a first pin fin 229A or other heat exchanger arrangement. The cooling fluid subsequently flows into the inlet connection tubes 236B of the second flow distribution insert 220B. As with the first flow distribution insert 220A, the second flow distribution insert 220B diverts cooling fluid into the second set of plate fins 226B and 227B through openings 237B along the length of inlet connection tubes 236B and receives the return flow through the openings 239B along the length of the outlet connection tubes 238B of the second flow distribution insert 220B.

The cooling fluid then flows out the outlet connection tubes 238B of the second flow distribution insert 220B and optionally through a second pin fin 229B or other heat exchanger arrangement. The cooling fluid subsequently flows into the inlet connection tubes 236C of the third flow distribution insert 220C. As with the first and second flow distribution inserts 220A and 220B, the third flow distribution insert 220C diverts cooling fluid into the third set of plate fins 226C and 227C and receives the return flow through the openings 239C in the outlet connection tubes 238C of the third flow distribution insert 220C. In the embodiment depicted in FIG. 6D there are only three fluid cores 230. Therefore, the cooling fluid that flows out of the outlet connection tubes 238C of the third flow distribution insert 220C flows directly into the outlet channel 218 in the manifold 210. The cooling fluid may then be cooled using an external condenser or other cooling system before the cooling fluid is reintroduced to the manifold 210.

Referring to FIG. 6E, a perspective view of a partially assembled internal structure of the double-sided multi-modular manifold cooling assembly coupled to a power electronics PCB 10 is depicted. The power PCB incudes planar inductors as depicted and described with reference to FIG. 1A. The "E" shaped portion 14A of the core may be partly received within heat sink 300 so that the core may be more directly cooled by the manifold 210.

Figure 7A:
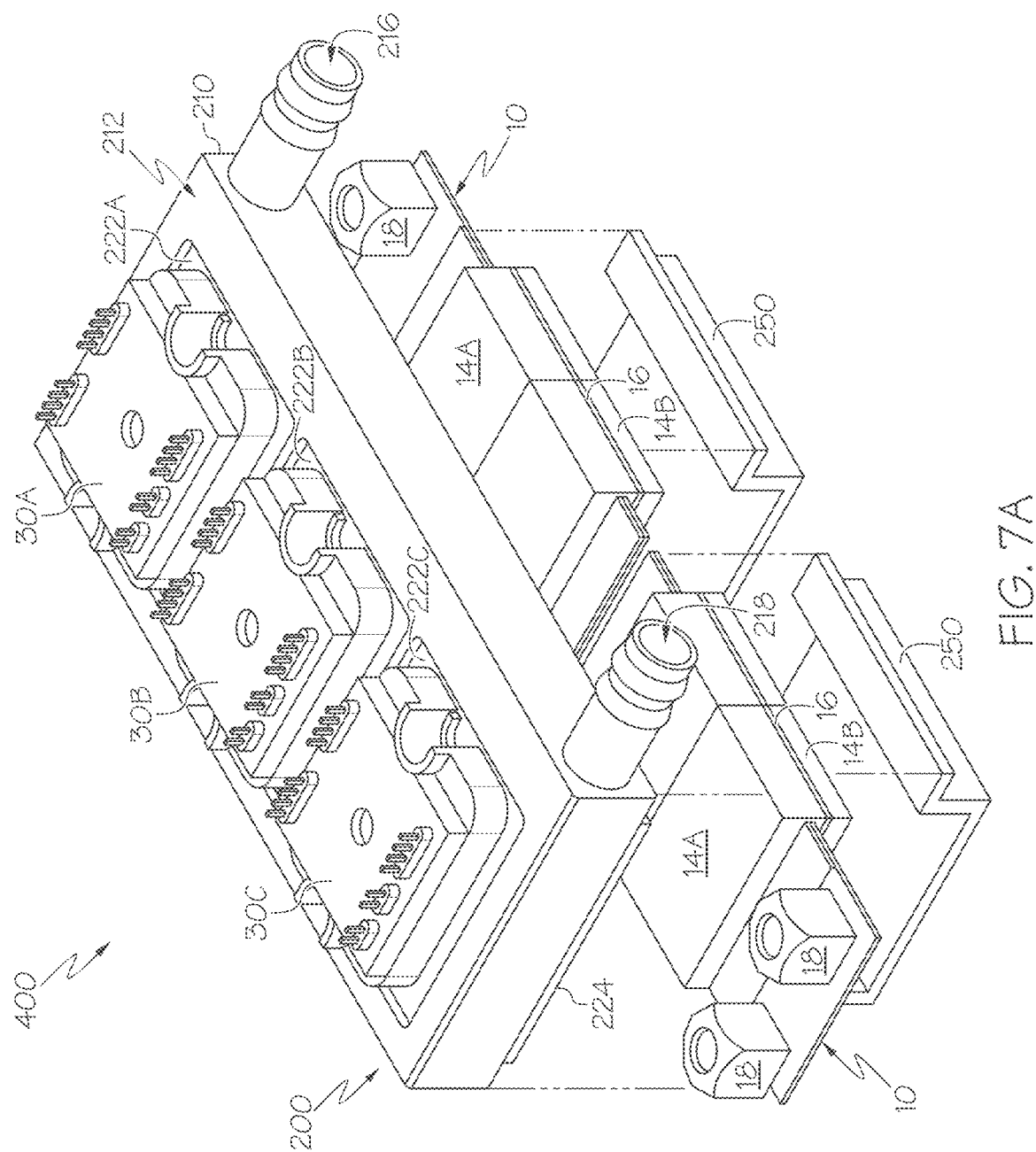
FIG. 7A schematically depicts an exploded perspective view of an electronic system utilizing a double-sided manifold cooling assembly according to one or more embodiments shown and described herein.
Figure 7B:
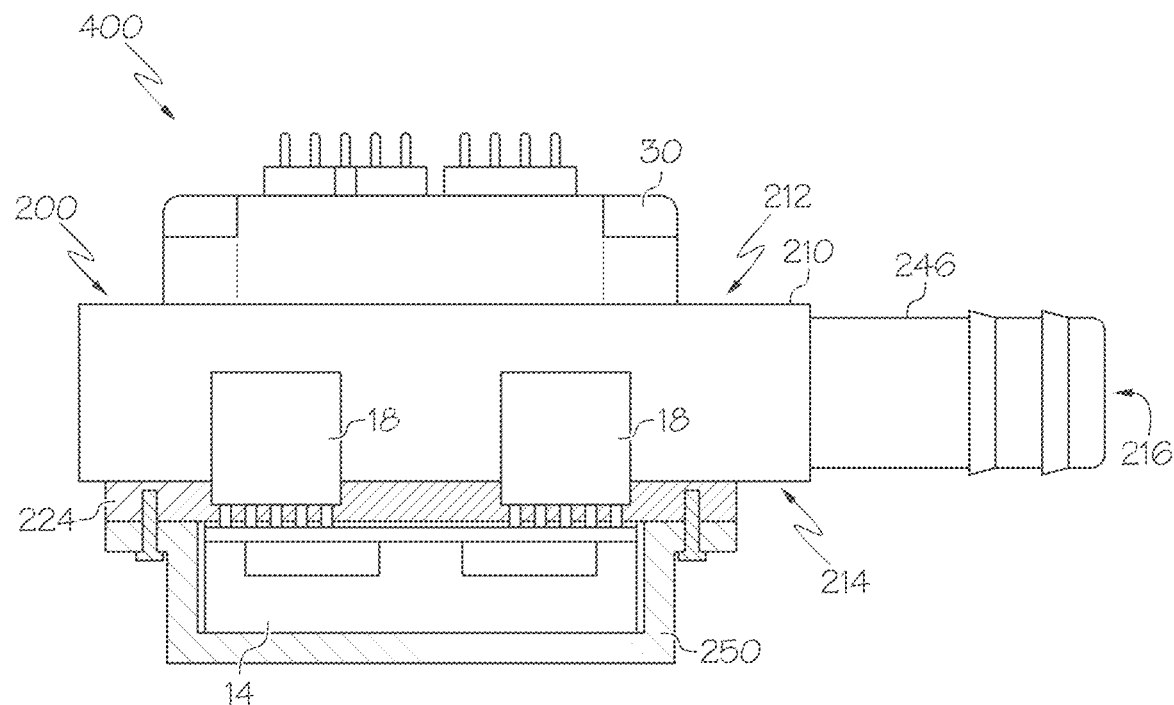
FIG. 7B schematically depicts a side end view of the electronic system utilizing a double-sided manifold cooling assembly according to one or more embodiments shown and described herein.

FIGS. 7A and 7B depict illustrative examples of an electronic system 400 having plurality of power modules 30A, 30B, and 30C coupled to the plurality of modular heat sinks 222A, 222B, and 222C, respectively on the first side 212 of the manifold 210. The second side 214 of the manifold 210 includes a power electronic PCBs 10 fastened to the heat sink 224. In some embodiments, a metal plate 250 is included to fasten the power electronic PCBs 10 more securely to the manifold 210 so that thermal conductivity between the core 14 and the manifold 210 is increased. However, the metal lid that covers the magnetics of the inductor causes some loss. FIG. 8 depicts the magnetic field surrounding the inductor core 14A and 14B. The coil 11 is depict in a cross-sectional view. The loss is mainly from the air gaps 16 between the core 14 of the inductors produce some magnetic field which will induce significant current in nearby conductors such as the metal lid. This part of the energy is lost in the form of heat. Therefore, the metal lids could be rotated by 90 degree, so that less magnetic field would pass through the metal lids, so that less loss is caused. There are some other forms of metal lids available and not limited to the one shown in the embodiments disclosed herein. For example, a metal lid 251 type shown in FIG. 9 may be utilized. The metal lid 251 has openings 252 on the side so that no metal piece is overlapped with the air gap 16 of the magnetic air gap. To maximize the heat flow path and mechanical rigidity, the two metal lids 251 could be combined to one piece. The metal lid 251 general design rule is to apply enough mechanical force to the ferrite, to provide enough thermal path to guide the cooling effect from the heat sink (e.g., heat sinks 224 or 300) to the top of the core (e.g., a ferrite), and to minimize the overlapping area between the metal lid 251 and the air gap 16.

Figure 10:
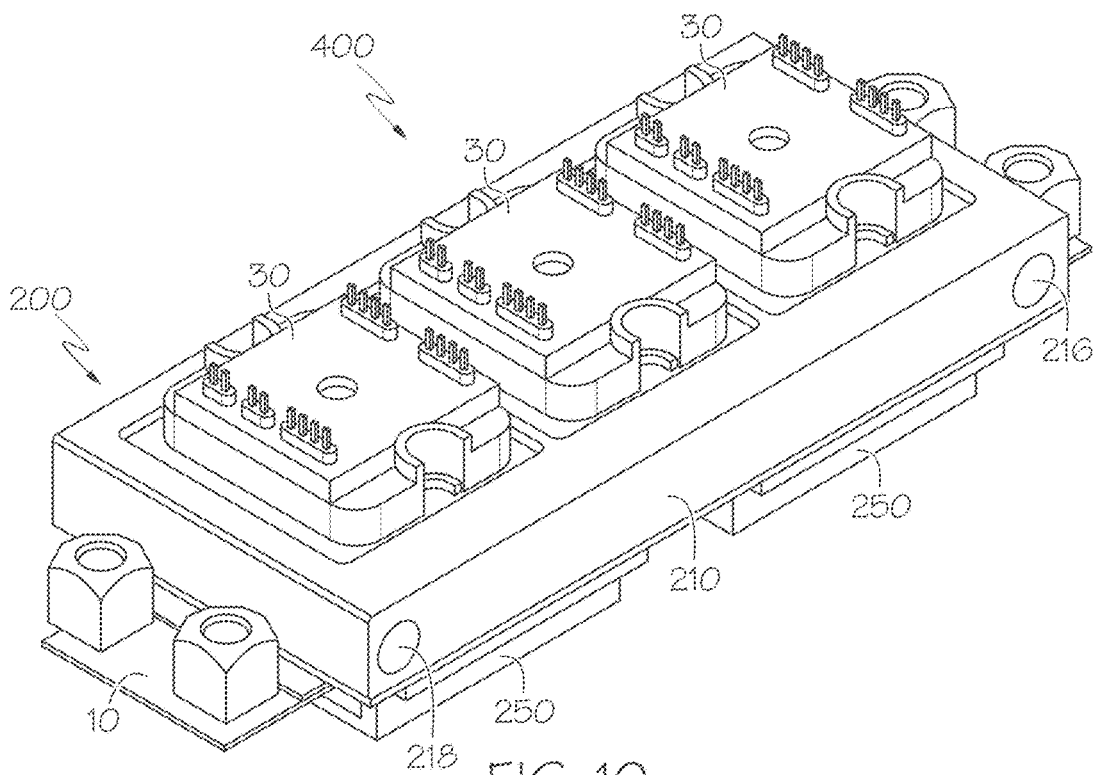
FIG. 10 schematically depicts a perspective view of a double-sided manifold cooling assembly according to one or more embodiments shown and described herein.
Figure 11A:
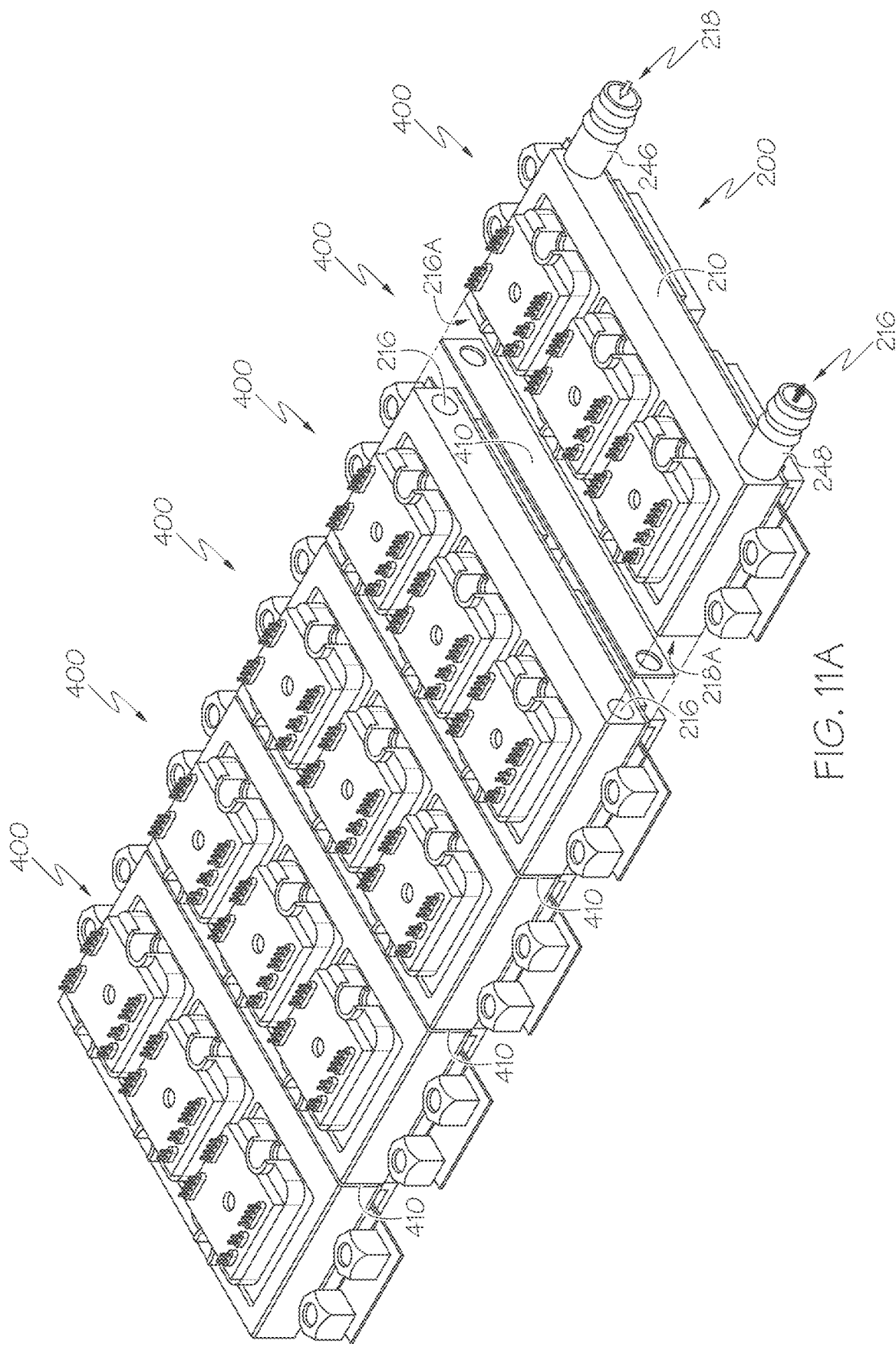
FIG. 11A schematically depicts a top perspective view of a cooling manifold system having a plurality of double-sided cold plate assemblies according to one or more embodiments shown and described herein.

FIG. 10 depicts a perspective assembled view of the electronic system 400 utilizing a cold plate 200 having a manifold 210 and fluid core 230 as disclosed herein. In particular, the manifold 210 depicted in FIG. 10 does not include inlet and outlet connection ports as depicted in previous figures. The manifold 210 depicted in FIG. 10 may be fluidly coupled and bonded to one or more other manifolds 210 to form a cooling manifold system. For example, FIGS. 11A and 11B depict different perspective views of a cooling manifold system having a plurality of electronic systems 400 utilizing one or more cold plates 200 having a manifold 210. In some embodiments, the manifolds 210 may be directly bonded to each other using techniques such as ultrasonic welding, direct bonding or other fastening techniques. In some embodiments, the manifolds 210 may be bonded together by metal-plastic direct bonding. For example, a joining plate 410 may be aligned between two manifolds 210 as shown in FIG. 11A so that the exit of the inlet and outlet channels of a first manifold are fluidly coupled to the inlet and outlet channels of a second manifold. The joining plate 410 may be made of aluminum, steel, copper, or another metal or alloy.

Figure 12A:
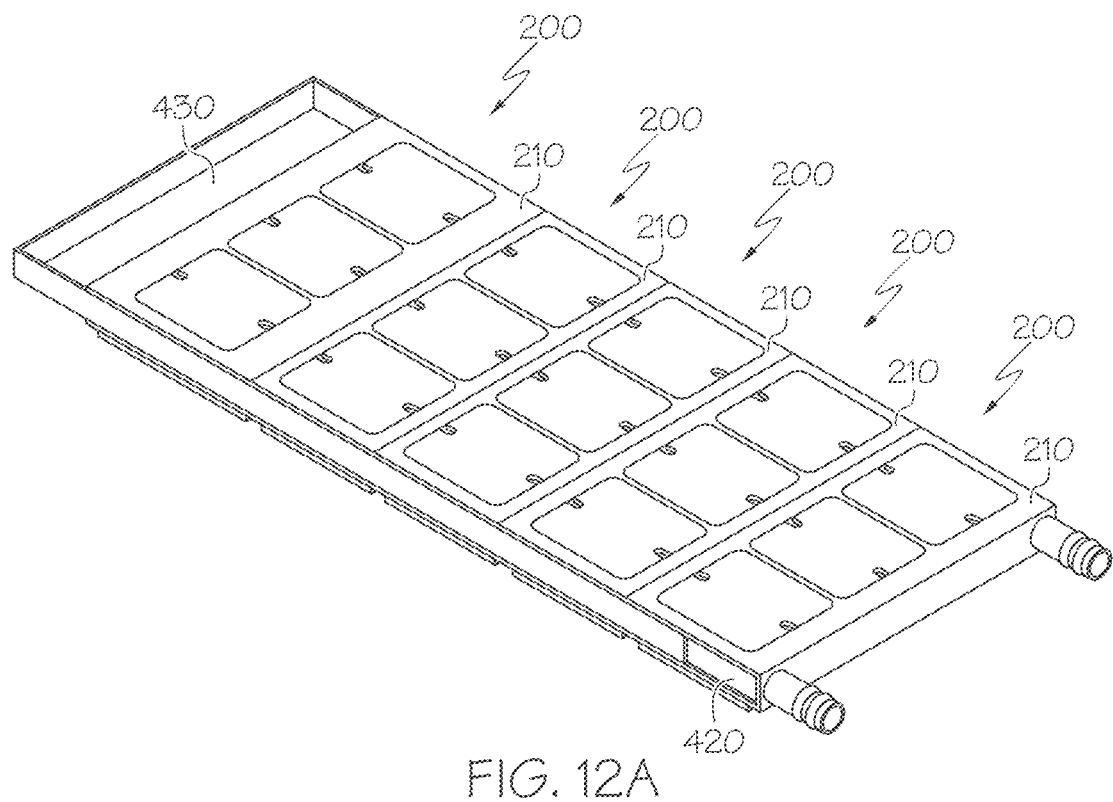
FIG. 12A schematically depicts a perspective view of a cooling manifold system assembled with a frame according to one or more embodiments shown and described herein.
Figure 12B:
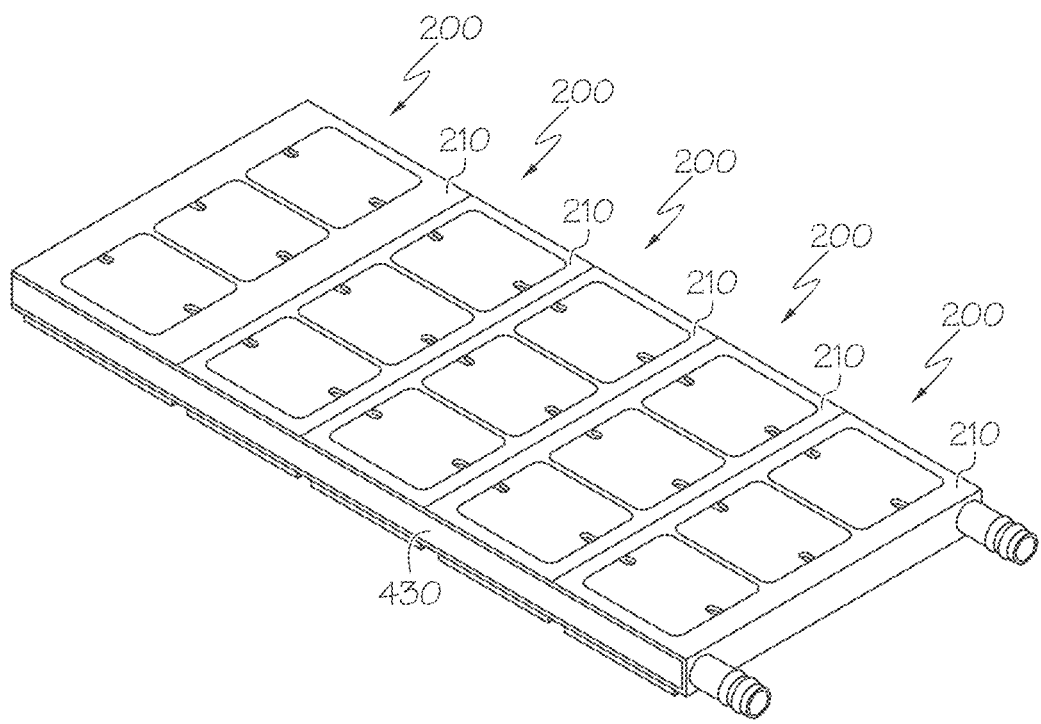
FIG. 12B schematically depicts a perspective view of a cooling manifold system assembled with the frame according to one or more embodiments shown and described herein.

In some embodiments, the process of metal-plastic direct bonding includes applying induction heat to the joining plate or other metal parts such as the heat sinks to heat the component for bonding. The metal parts are heated to a plastic melting temperature and the plastic and the joining plates are pressed together at a predefined steady pressure to bond the parts together. In the aforementioned example process, it is assumed that the manifold is made of plastic; however, embodiments of the manifold are not limited to plastic materials. Additionally, it should be understood that metal-plastic direct bonding may be utilized to bond heat sinks to the manifold and/or a manifold to another manifold with a metal plate. Furthermore, the bonding processes for joining components of the cooling manifold system are not limited to metal-plastic direct bonding. In some embodiments, for example, as depicted in FIGS. 12A and 12B the manifold 210 may be formed to have a slot 420 along a widthwise surface. A frame element 430 may be slid into place within the slot to mechanically join a plurality of manifolds 210 together. The frame element 430 may be used to reinforce the cooling manifold assembly.

Figure 13:
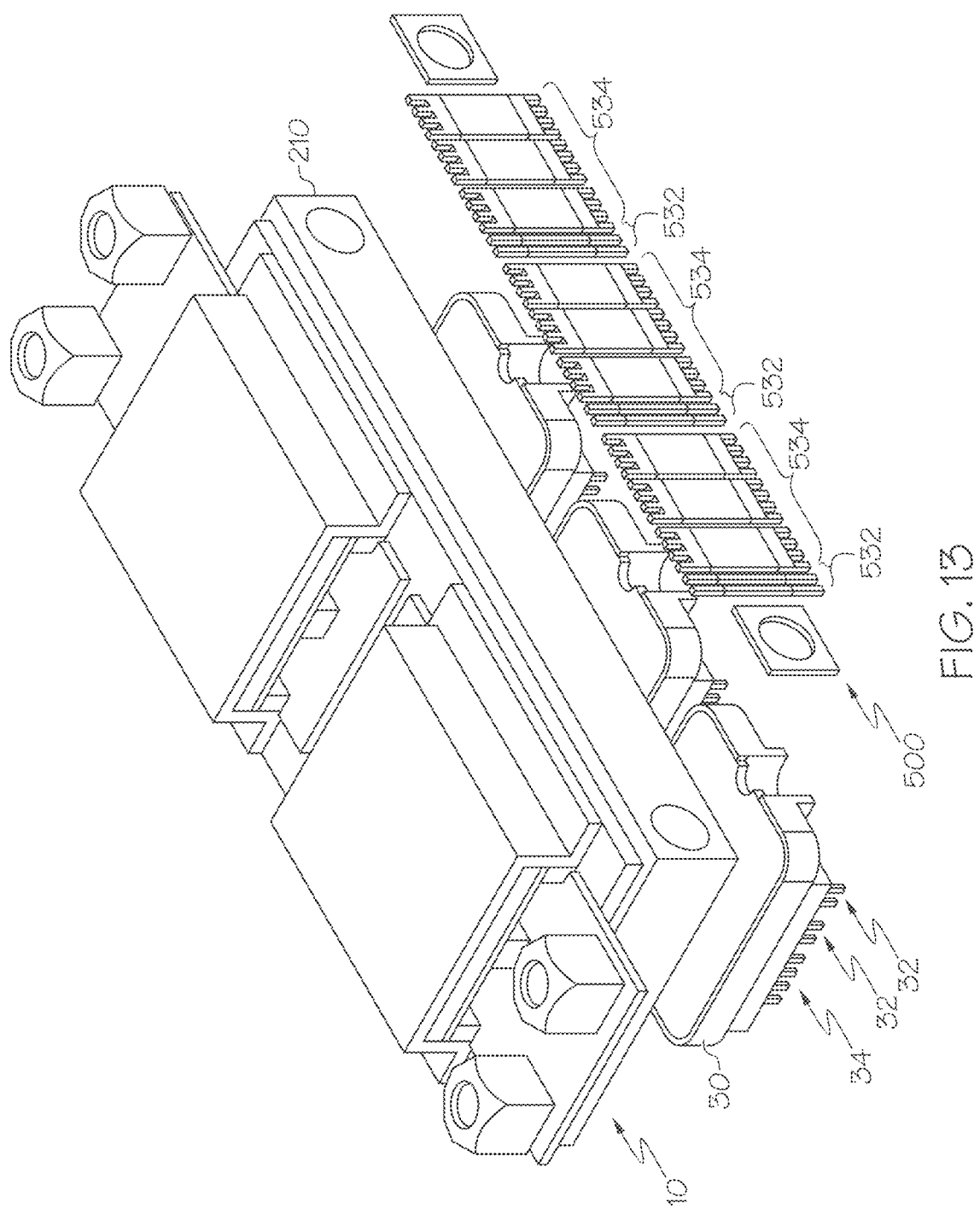
FIG. 13 schematically depicts an exploded perspective view including a power signal connector according to one or more embodiments shown and described herein.
Figure 14:
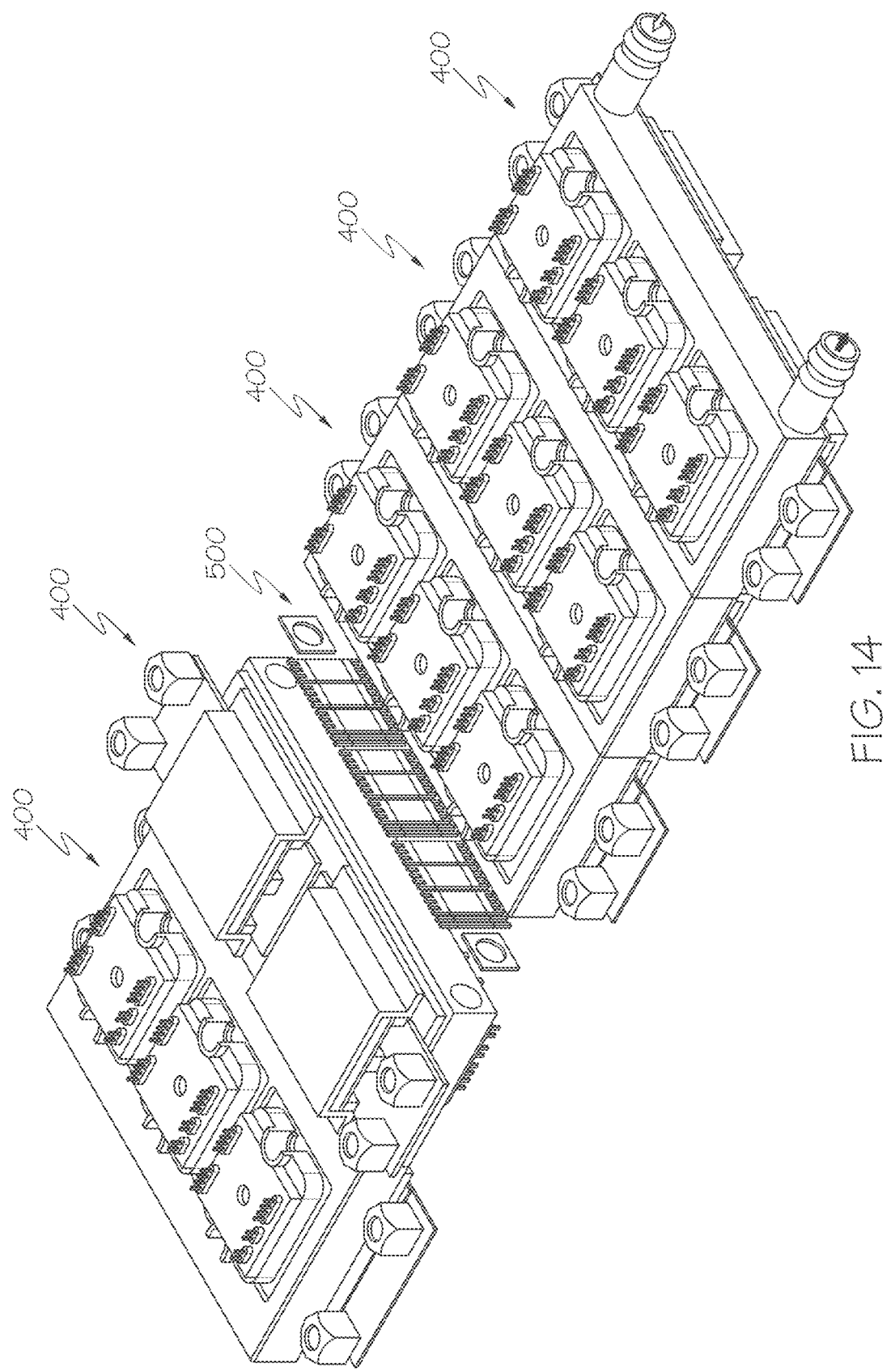
FIG. 14 schematically depicts a perspective view of a cooling manifold system assembled utilizing the power signal connector positioned between and joining double-sided manifold cooling assemblies according to one or more embodiments shown and described herein.

In yet further embodiments, such as the one depicted in FIG. 13, the joining part used to join manifolds 210 may be include a plurality of isolated conductive paths that are utilized as electrical connections between electronic components on opposite sides of the manifold and/or between electronic components on adjacent manifolds. For example, the joining plate 500 may include a plurality of isolated conductive paths, for example, including signal connectors 532 and power connectors 534. The signal connectors 532 and power connectors 534 can facilitate electrical connection from a signal connector 32 and power connector 34 of a power module 30 on one side of a first manifold 210 to a power module 30 on an opposite side of the first manifold 210 or an opposite side of an adjacent manifold 210. For example, to accomplish a low resistance and compact electrical system 400 utilizing a cooling manifold system where the manifolds are configurable and asymmetric, it may be possible to orient the manifolds 210 (i.e., the cold plates 200) in the cooling manifold system in opposing directions as shown in FIG. 14. For example, a middle cold plate is oriented so that the power modules 30 coupled to adjacent cold plates face opposite directions and a joining plate 500 is utilized to provide direct electrical connections between the opposite facing power modules 30.

It should now be understood that an assembly of asymmetric configurable double-sided manifold micro-channel cold plates include a manifold having a recess extending from a first side to a second side of the manifold. The recess includes openings to the recess positioned lengthwise along the first side and a single opening to the recess on the second side, an inlet and an outlet fluidly coupled to the recess. A plurality of plates may be fastened to the first side enclosing the openings, a heat sink may be fastened to the second side enclosing the single opening on the second side, and a plurality of fluid cores one of each positioned between each of the plurality of plates and the heat sink are included within the recess. The plurality of fluid cores include a flow distribution insert, a first plate fin positioned between the flow distribution insert and the heat sink fastened to the second side, and a second plate fin positioned between the flow distribution insert and the heat sink.

The flow distribution insert of the first fluid core is configured to receive fluid from the inlet channel, divert the received fluid into the first and second plate fins, receive a return fluid flow from the first and second plate fins, and expel the return fluid flow out of an outlet connection tube of the flow distribution insert of the first fluid core such that the fluid flows through the pin fin and is further received at an inlet connection tube of the flow distribution insert of the second fluid core.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cold plate, comprising:
   a manifold;
   a plurality of openings on a first side of the manifold extending through the manifold into a single opening formed in a second side of the manifold, thereby forming a recess within the manifold between the first and second sides;
   an inlet and outlet channel fluidly coupled to the recess;
   a plurality of heat sinks enclosing the plurality of openings on the first side;
   a heat sink enclosing the single opening on the second side; and
   a plurality of fluid cores, each positioned between each of the plurality of heat sinks and the heat sink, the plurality of fluid cores comprising:
      a flow distribution insert,
      a first plate fin positioned between a first side of the flow distribution insert and a heat sink enclosing one of the plurality of openings on the first side, and
      a second plate fin positioned between a second side of the flow distribution insert and the heat sink enclosing the single opening, wherein the flow distribution insert is configured to receive a fluid, divert the received fluid into the first and second plate fins, and receive a return of the fluid from the first and second plate fins.

2. The cold plate of claim 1, wherein the flow distribution insert comprises:
   an inlet connection tube configured to receive the fluid from the inlet channel,
   a first opening along a length of the inlet connection tube configured to divert a portion of the fluid into the first plate fin,
   a second opening along the length of the inlet connection tube configured to divert a portion of the fluid into the second plate fin, and
   an outlet connection tube configured to receive the fluid from the first and second plate fins.

3. The cold plate of claim 2, wherein a plurality of flow channels of the first plate fin are perpendicular to the inlet connection tube of the flow distribution insert.

4. The cold plate of claim 2, wherein the inlet connection tube comprises a cross-sectional area that decreases along the length of the inlet connection tube from an inlet opening of the inlet connection tube.

5. The cold plate of claim 1, further comprising a pin fin positioned between a first fluid core of the plurality of fluid cores and a second fluid core of the plurality of fluid cores.

6. The cold plate of claim 5, wherein the flow distribution insert of the first fluid core is configured to receive the fluid from the inlet channel, divert the received fluid into the first and second plate fins, receive a return fluid flow from the first and second plate fins, and expel the return fluid flow out of an outlet connection tube of the flow distribution insert of the first fluid core such that the fluid flows through the pin fin and further received at an inlet connection tube of the flow distribution insert of the second fluid core.

7. The cold plate of claim 1, further comprising an inlet opening in a front surface of the manifold and an inlet exit opening in a rear surface opposite the front surface and the inlet channel extends between the inlet opening and the inlet exit opening along the width of the manifold.

8. The cold plate of claim 1, further comprising an outlet opening in a front surface of the manifold and an outlet exit opening in a rear surface opposite the front surface and the outlet channel extends between the outlet opening and the outlet exit opening along the width of the manifold.

9. The cold plate of claim 1, further comprising a fluid input connector fluidly coupled to the inlet channel and a fluid output connector fluidly coupled to the outlet channel.

10. A cooling manifold system, comprising:
    a plurality of manifolds fluidly coupled in parallel, wherein at least one manifold of the plurality of manifolds comprises:
       a plurality of openings on a first side of the manifold extending through the manifold into a single opening formed in a second side of the manifold, thereby forming a recess within the manifold between the first and second sides;
       an inlet and outlet channel fluidly coupled to the recess;
       a plurality of heat sinks enclosing the plurality of openings on the first side;
       a heat sink enclosing the single opening on the second side; and a plurality of fluid cores, each positioned between each of the plurality of heat sinks and the heat sink, the plurality of fluid cores comprising:
a flow distribution insert,
a first plate fin positioned between a first side of the flow distribution insert and a heat sink enclosing one of the plurality of openings on the first side, and
a second plate fin positioned between a second side of the flow distribution insert and the heat sink enclosing the single opening, wherein the flow distribution insert is configured to receive a fluid, divert the received fluid into the first and second plate fins, and receive a return of the fluid from the first and second plate fins.

11. The cooling manifold system of claim 10, wherein a first manifold and a second manifold of the plurality of manifolds are bonded to each other via a joining plate.

12. The cooling manifold system of claim 11, wherein a metal-plastic direct bonding process is utilized to bond the joining plate to the first and second manifolds.

13. The cooling manifold system of claim 11, wherein the joining plate comprises a plurality of isolated conductive paths to facilitate an electrical connection between electronic components coupled to opposite sides of a manifold.

14. The cooling manifold system of claim 10, wherein an inlet channel of a first manifold of the plurality of manifolds and an inlet channel of a second manifold of the plurality of manifolds are fluidly coupled.

15. The cooling manifold system of claim 10, wherein an outlet channel of a first manifold of the plurality of manifolds and an outlet channel of a second manifold of the plurality of manifolds are fluidly coupled.

16. The cooling manifold system of claim 10, wherein a first manifold and a second manifold of the plurality of manifolds are directly bonded to each other.

17. An electronic system, comprising:
a cold plate comprising:
a manifold;
a plurality of openings on a first side of the manifold extending through the manifold into a single opening formed in a second side of the manifold, thereby forming a recess within the manifold between the first and second sides;
an inlet and outlet channel fluidly coupled to the recess;
a plurality of heat sinks enclosing the plurality of openings on the first side;
a heat sink enclosing the single opening on the second side; and
a plurality of fluid cores, each positioned between each of the plurality of heat sinks and the heat sink, the plurality of fluid cores comprising:
a flow distribution insert,
a first plate fin positioned between a first side of the flow distribution insert and a heat sink enclosing one of the plurality of openings on the first side, and
a second plate fin positioned between a second side of the flow distribution insert and the heat sink enclosing the single opening, wherein the flow distribution insert is configured to receive a fluid, divert the received fluid into the first and second plate fins, and receive a return of the fluid from the first and second plate fins;
a power electronics printed circuit board coupled to the heat sink; and
a power module coupled to one of the plurality of heat sinks.

18. The electronic system of claim 17, wherein the power electronics printed circuit board comprises a planar inductor having a planar coil embedded within the power electronics printed circuit board and a ferrite core enclosing the power electronics printed circuit board.

19. The electronic system of claim 18, wherein the ferrite core is thermally coupled to the heat sink.

20. The electronic system of claim 18, wherein the power electronics printed circuit board comprises a metal lid enclosing the ferrite core.

* * * * *